(12) United States Patent
Kim et al.

(10) Patent No.: US 12,588,516 B2
(45) Date of Patent: Mar. 24, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Jinhyuk Kim, Suwon-si (KR); Jeongyong Sung, Suwon-si (KR); Joongshik Shin, Suwon-si (KR); Jeehoon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 325 days.

(21) Appl. No.: 18/227,357

(22) Filed: Jul. 28, 2023

(65) Prior Publication Data

US 2024/0145400 A1 May 2, 2024

(30) Foreign Application Priority Data

Oct. 27, 2022 (KR) ........................ 10-2022-0140657

(51) Int. Cl.
  *H01L 23/544* (2006.01)
  *H10B 41/27* (2023.01)
  (Continued)

(52) U.S. Cl.
  CPC ........... *H01L 23/544* (2013.01); *H10B 41/27* (2023.02); *H10B 41/35* (2023.02); *H10B 43/27* (2023.02);
  (Continued)

(58) Field of Classification Search
  CPC .......... H01L 2223/54426; H10B 43/40; H10B 41/40; H10B 43/35; H10B 43/27; H10B 41/27; H10B 41/35
  See application file for complete search history.

(56) References Cited

U.S. PATENT DOCUMENTS

| | | | |
|---|---|---|---|
| 2020/0350331 A1 | 11/2020 | Kim | |
| 2021/0091112 A1* | 3/2021 | Nakajima | ............. H01L 23/544 |

(Continued)

FOREIGN PATENT DOCUMENTS

| | | |
|---|---|---|
| KR | 10-1997-0051844 A | 7/1997 |
| KR | 10-2021-0148745 A | 12/2021 |

(Continued)

OTHER PUBLICATIONS

Extended European Search Report dated Mar. 19, 2024 for corresponding application No. EP 23199633.1.

*Primary Examiner* — John A Bodnar
(74) *Attorney, Agent, or Firm* — Muir Patent Law, PLLC

(57) ABSTRACT

A semiconductor device includes a substrate having first and second regions; a first stack structure including lower gate electrodes stacked in a first direction in the first region; a first channel structure penetrating through the first stack structure; a second stack structure on the first stack structure and the first channel structure and including upper gate electrodes stacked in the first direction; a second channel structure penetrating through the second stack structure; a first mold structure including lower horizontal sacrificial layers stacked in the second region; an alignment structure penetrating through the first mold structure; and a second mold structure on the first mold structure and the alignment structure and including upper horizontal sacrificial layers stacked, wherein the number of the lower horizontal sacrificial layers is less than the number of the lower gate electrodes.

20 Claims, 20 Drawing Sheets

(51) Int. Cl.
    H10B 41/35     (2023.01)
    H10B 43/27     (2023.01)
    H10B 43/35     (2023.01)

(52) U.S. Cl.
    CPC .... H10B 43/35 (2023.02); *H01L 2223/54426*
                     (2013.01)

(56) References Cited

U.S. PATENT DOCUMENTS

| | | |
|---|---|---|
| 2021/0175133 A1 | 6/2021 | Choi et al. |
| 2021/0375905 A1 | 12/2021 | Hwang et al. |
| 2022/0102369 A1 | 3/2022 | Chung et al. |
| 2022/0123019 A1 | 4/2022 | Kim et al. |
| 2022/0199626 A1 | 6/2022 | Chung et al. |

FOREIGN PATENT DOCUMENTS

| | | |
|---|---|---|
| KR | 10-2022-0013800 A | 2/2022 |
| KR | 10-2022-0041982 A | 4/2022 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority under 35 U.S.C. § 119 to Korean Patent Application No. 10-2022-0140657 filed on Oct. 27, 2022, in the Korean Intellectual Property Office, the disclosure of which is incorporated herein by reference in its entirety.

BACKGROUND

Example embodiments of the present disclosure relate to a semiconductor device and a data storage system including the same.

A semiconductor device able to store high-capacity data in a data storage system requiring data storage has been necessary. Accordingly, a method for increasing data storage capacity of a semiconductor device has been researched. For example, as a method for increasing data storage capacity of a semiconductor device, a semiconductor device including memory cells arranged three-dimensionally, instead of memory cells arranged two-dimensionally, has been suggested.

SUMMARY

An example embodiment of the present disclosure is to provide a semiconductor device having improved reliability.

An example embodiment of the present disclosure is to provide a data storage system including a semiconductor device having improved reliability.

According to an example embodiment of the present disclosure, a semiconductor device includes a substrate having first and second regions; a first stack structure including lower gate electrodes stacked and spaced apart from each other in a first direction perpendicular to an upper surface of the substrate in the first region; a first channel structure penetrating through the first stack structure and in contact with the substrate; a second stack structure on the first stack structure and the first channel structure and including upper gate electrodes stacked and spaced apart from each other in the first direction; a second channel structure penetrating through the second stack structure and connected to the first channel structure; a first mold structure including lower horizontal sacrificial layers stacked and spaced apart from each other in the first direction in the second region; an alignment structure penetrating through the first mold structure and in contact with the substrate; and a second mold structure on the first mold structure and the alignment structure and including upper horizontal sacrificial layers stacked and spaced apart from each other in the first direction, wherein the number of the lower horizontal sacrificial layers is less than the number of the lower gate electrodes.

According to an example embodiment of the present disclosure, a semiconductor device includes a substrate having first and second regions; a first stack structure including lower gate electrodes stacked and spaced apart from each other in a first direction perpendicular to an upper surface of the substrate in the first region; a first channel structure penetrating through the first stack structure; a second stack structure on the first stack structure and the first channel structure and including upper gate electrodes stacked and spaced apart from each other in the first direction; a second channel structure penetrating through the second stack structure and connected to the first channel structure; a first mold structure including lower horizontal sacrificial layers stacked and spaced apart from each other in the first direction in the second region; an alignment structure penetrating through the first mold structure; a second mold structure on the first mold structure and the alignment structure and including upper horizontal sacrificial layers stacked and spaced apart from each other in the first direction, wherein a distance between an uppermost lower gate electrode among the lower gate electrodes and an upper end of the first channel structure is less than a distance between an uppermost lower horizontal sacrificial layer among the lower horizontal sacrificial layers and an upper end of the alignment structure in the first direction.

According to an example embodiment of the present disclosure, a data storage system includes a semiconductor storage device including a substrate having first and second regions, circuit devices on one side of the substrate, and input/output pads electrically connected to the circuit devices; and a controller electrically connected to the semiconductor storage device through the input/output pad and controlling the semiconductor storage device, wherein the semiconductor storage device further includes a first stack structure including lower gate electrodes stacked and spaced apart from each other in a first direction perpendicular to an upper surface of the substrate in the first region; a first channel structure penetrating the first stack structure and in contact with the substrate; a second stack structure on the first stack structure and the first channel structure and including upper gate electrodes stacked and spaced apart from each other in the first direction; a second channel structure penetrating through the second stack structure and connected to the first channel structure; a first mold structure including lower horizontal sacrificial layers stacked and spaced apart from each other in the first direction in the second region; an alignment structure penetrating through the first mold structure and in contact with the substrate; and a second mold structure on the first mold structure and the alignment structure and including upper horizontal sacrificial layers stacked and spaced apart from each other in the first direction, and wherein the number of the lower horizontal sacrificial layers is less than the number of the lower gate electrodes.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings. Like numerals refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1:
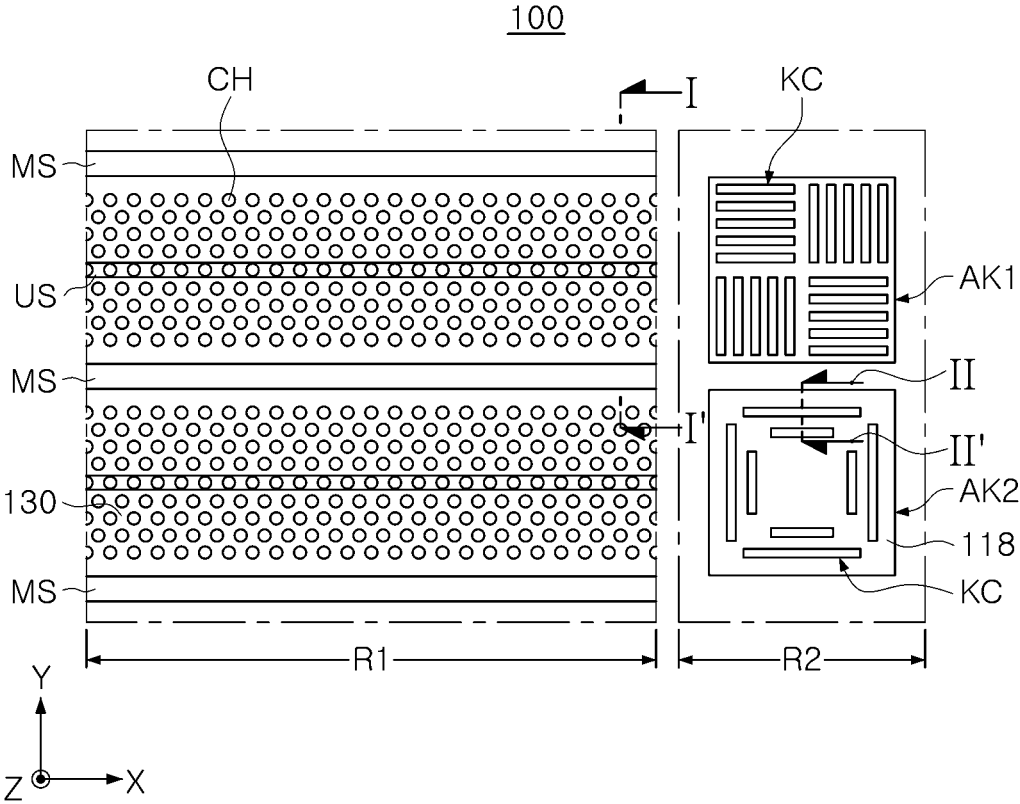
FIG. 1 is a plan view illustrating a semiconductor device according to an example embodiment of the present disclosure.

FIG. 1 is a plan view illustrating a semiconductor device according to an example embodiment.

Figure 2:
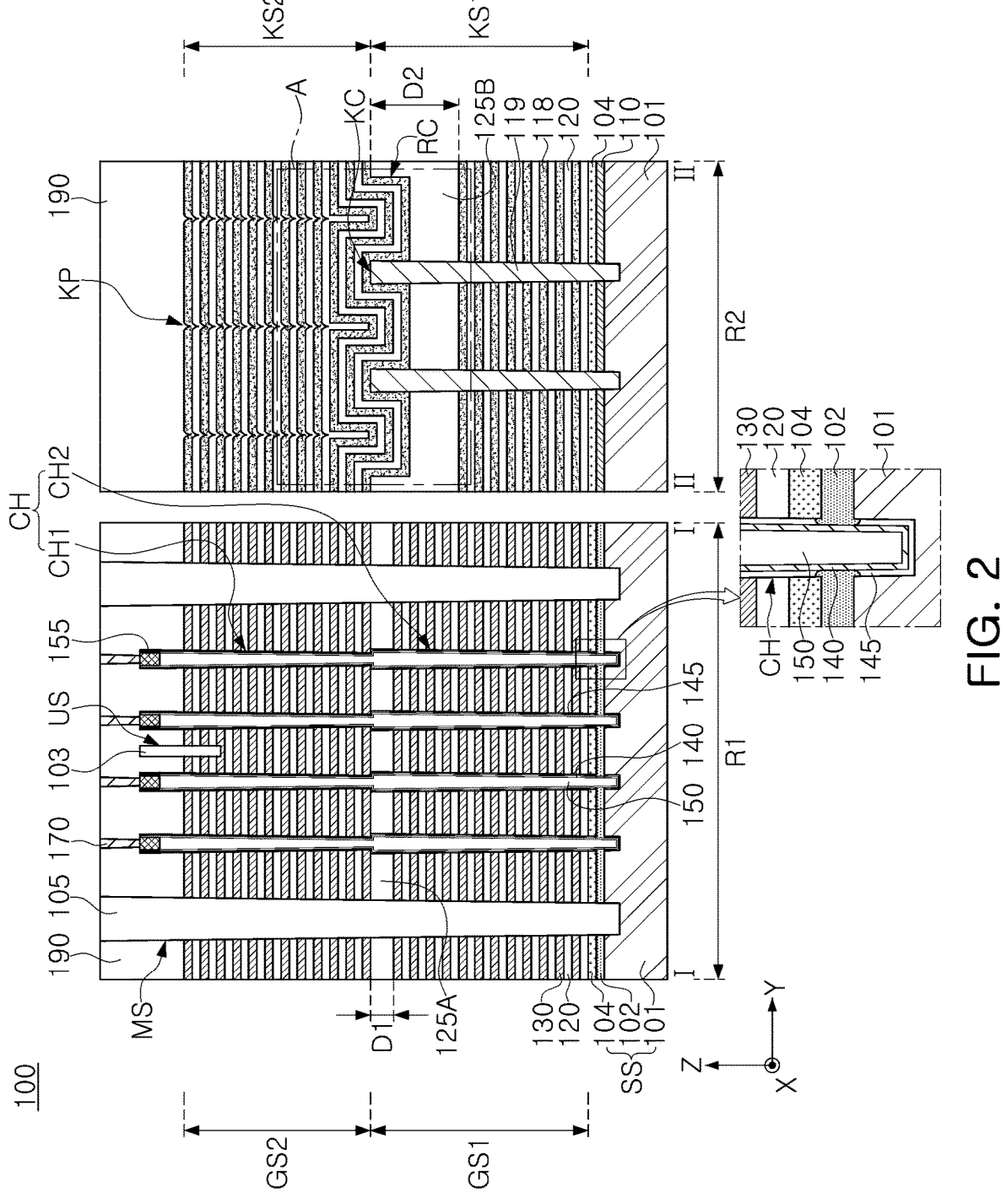
FIG. 2 is a cross-sectional view illustrating a semiconductor device according to an example embodiment of the present disclosure.

FIG. 2 is a cross-sectional view illustrating a semiconductor device according to an example embodiment, taken along lines I-I' and II-II' in FIG. 1.

Figure 3:
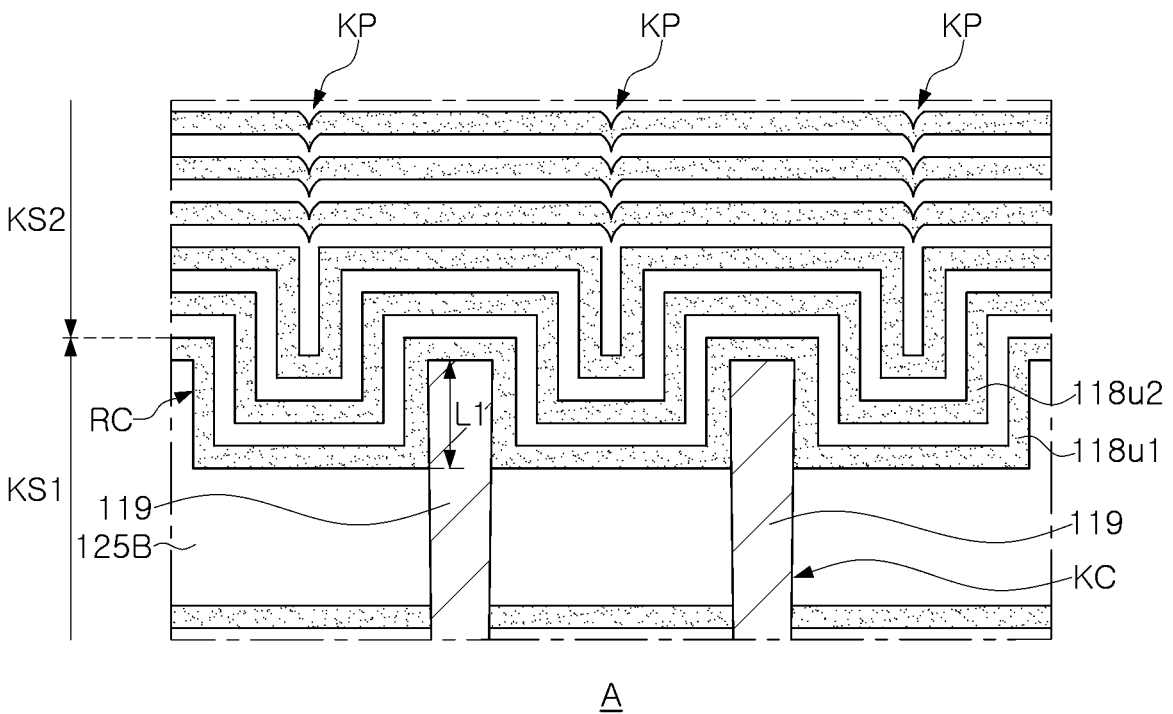
FIG. 3 is an enlarged view illustrating partial regions of a semiconductor device according to an example embodiment of the present disclosure.

FIG. 3 is an enlarged view illustrating partial regions of a semiconductor device according to an example embodiment, illustrating region "A" in FIG. 2.

Referring to FIGS. 1 to 3, the semiconductor device 100 may include a substrate 101 having first and second regions R1 and R2.

In the first region R1, the semiconductor device 100 may include first and second horizontal conductive layers 102 and 104 on the substrate 101, first and second stack structures GS1 and GS2 each including gate electrodes 130 and interlayer insulating layers 120, channel structures CH disposed to penetrate through the first and second stack structures GS1 and GS2 and each including a channel layer 140, upper isolation regions US penetrating a portion of the second stack structure GS2, isolation regions MS extending by penetrating through the first and second stack structures GS1 and GS2, and contact plugs 170 on the channel structures CH, and a cell region insulating layer 190 covering the first and second stack structures GS1 and GS2.

In the second region R2, the semiconductor device 100 may include at least one alignment key region AK1 and AK2. In the second region R2, the semiconductor device 100 may include a horizontal insulating layer 110 on the substrate 101, a second horizontal conductive layer 104 on the horizontal insulating layer 110, first and second mold structures KS1 and KS2 each including horizontal sacrificial layers 118 and interlayer insulating layers 120, alignment structures KC penetrate through the first mold structure KS1, and a cell region insulating layer 190 covering the first and second mold structures KS1 and KS2.

In the semiconductor device 100, in the first region R1, memory cell strings including memory cells may be disposed around the channel structures CH, and the second region R2 may be disposed on the external side of the first region R1, and in the second region R2, memory cells may not be disposed. For example, the semiconductor device 100 may further include a peripheral circuit region including circuit devices for applying electrical signals to the memory cells of the first region R1, and the second region R2 may be disposed on one side of the peripheral circuit region or may be a dummy region disposed on an external side of the peripheral circuit region. In some example embodiments, the second region R2 may be disposed on a scribe lane between memory chip regions. In this case, the second region R2 may be a region that remains in the semiconductor device 100 after dicing. Alternatively, the semiconductor device 100 may be a semiconductor structure before being diced.

The substrate 101 may have an upper surface extending in X- and Y-directions. The X- and Y-directions may be perpendicular to one another and parallel to an upper surface of the substrate 101. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, or a semiconductor on insulator (SeOI) layer.

The first and second regions R1 and R2 of the substrate 101 may be spaced apart from each other. In example embodiments, for ease of description, the first and second regions R1 and R2 may be referred to as regions of the substrate 101, but the first and second regions R1 and R2 may also be referred to as regions of the semiconductor device 100.

The first and second horizontal conductive layers 102 and 104 may be stacked in order on the upper surface of the first region R1 of the substrate 101. The first and second horizontal conductive layers 102 and 104 may form a source structure SS together with the substrate 101. The source structure SS may function as a common source line of the semiconductor device 100. As illustrated in the enlarged view in FIG. 2, the first horizontal conductive layer 102 may be directly connected to the channel layer 140 on the circumference of the channel layer 140. For example, the first horizontal conductive layer 102 may contact a sidewall of the channel layer 140.

The first and second horizontal conductive layers 102 and 104 may include a semiconductor material, for example, polycrystalline silicon. In this case, at least the first horizontal conductive layer 102 may be a layer doped with impurities having the same conductivity as that of the substrate 101. The second horizontal conductive layer 104 may be a doped layer or an intrinsic semiconductor layer including impurities diffused from the first horizontal conductive layer 102. However, the material of the second horizontal conductive layer 104 is not limited to a semiconductor material, and may be replaced with an insulating layer in example embodiments. In example embodiments, an insulating layer having a relatively thin thickness may be interposed between the first horizontal conductive layer 102 and the second horizontal conductive layer 104.

The horizontal insulating layer 110 may be disposed on the substrate 101 in the second region R2 on the same level as a level of the first horizontal conductive layer 102 in the first region R1. The horizontal insulating layer 110 may include a plurality of insulating layers alternately stacked on the substrate 101. The horizontal insulating layer 110 may be layers remaining after a portion of the horizontal insulating layer 110 is replaced with the first horizontal conductive layer 102 in the process of manufacturing the semiconductor device 100. The horizontal insulating layer 110 may include at least one of silicon oxide, silicon nitride, silicon carbide, and silicon oxynitride.

The first and second stack structures GS1 and GS2 may be stacked in order from the substrate 101 in the Z-direction. The Z-direction may be perpendicular to an upper surface of the substrate 101. Each of the first and second stack structures GS1 and GS2 may include gate electrodes 130 and interlayer insulating layers 120 alternately disposed with the gate electrodes 130. The first stack structure GS1 may further include a first upper interlayer insulating layer 125A disposed on an uppermost portion and having a relatively thick thickness.

The gate electrodes 130 may be vertically stacked and spaced apart from each other on the substrate 101 in the first region R1 and may form first and second stack structures GS1 and GS2. In the claims, the gate electrodes 130 of the first stack structure GS1 may be referred to as lower gate electrodes, and the gate electrodes 130 of the second stack structure GS2 may be referred to as upper gate electrodes.

Among the gate electrodes 130, at least one gate electrode 130 including the lowermost gate electrode 130 may form a ground selection transistor, and at least one gate electrode 130 including the uppermost gate electrode 130 may form a string select transistor. The other gate electrodes 130 may form a plurality of memory cells, and the number of gate electrodes 130 forming memory cells may be determined according to capacitance of the semiconductor device 100. In example embodiments, the gate electrode 130 disposed above the string select transistor and/or below the ground select transistor may form an erase transistor used for an erase operation using gate induced drain leakage (GIDL) phenomenon. Also, a portion of the gate electrodes 130, for example, the gate electrode 130 above and/or below the gate electrodes 130 included in the memory cells may be dummy gate electrodes.

The gate electrodes 130 may be separated in a predetermined unit in the Y-direction by isolation regions MS. Gate electrodes 130 between a pair of isolation regions MS may form a memory block, but the example of the memory block is not limited thereto.

The gate electrodes 130 may include a metal material, such as tungsten (W). In example embodiments, the gate electrodes 130 may include polycrystalline silicon or a metal silicide material. In example embodiments, the gate electrodes 130 may further include a diffusion barrier. For example, the diffusion barrier may include tungsten nitride (WN), tantalum nitride (TaN), or titanium nitride (TiN), or a combination thereof.

The first and second mold structures KS1 and KS2 may be stacked in order from the substrate 101 in the Z-direction. Each of the first and second mold structures KS1 and KS2 may include horizontal sacrificial layers 118 and interlayer insulating layers 120 alternately disposed with the horizontal sacrificial layers 118. The first mold structure KS1 may further include a second upper interlayer insulating layer 125B disposed on an uppermost portion and having a relatively thick thickness.

The first mold structure KS1 may be disposed on the same level as a level of the first stack structure GS1 in at least a portion of regions, and the second mold structure KS2 may be disposed on the same level as a level of the second stack structure GS2 in at least a portion of regions. The level of the first mold structure KS1 may overlap the level of the first stack structure GS1, and the level of the second mold structure KS2 may overlap the level of the second stack structure GS2.

The second mold structure KS2 may be recessed into the first mold structure KS1, for example, the second upper interlayer insulating layer 125B, to a predetermined thickness around the alignment structures KC. Accordingly, the horizontal sacrificial layers 118 and the interlayer insulating layers 120 included in the second mold structure KS2 may have key pattern portions KP, recessed regions or depressions. In each of the horizontal sacrificial layers 118 and the interlayer insulating layers 120, the shapes of the key pattern portions KP may be slightly different. The bent shape of the key pattern portions KP may have a gradual relief toward an upper portion of the second mold structure KS2, and for example, a portion of layers including the uppermost horizontal sacrificial layer 118 and the uppermost interlayer insulating layer 120 may have key pattern portions KP having a notch shape. In some example embodiments, the key pattern portion KP may have a shape of a recessed portion having a bottom region formed along circumferences of the alignment structures KC1, rather than having a single notch shape as illustrated in FIG. 2.

The horizontal sacrificial layers 118 may be vertically stacked and spaced apart from each other on the substrate 101 in the second region R2 and may form first and second mold structures KS1 and KS2. In the claims, the horizontal sacrificial layers 118 of the first mold structure KS1 may be referred to as a lower horizontal sacrificial layer, and the horizontal sacrificial layers 118 of the second mold structure KS2 may be referred to as an upper horizontal sacrificial layer. The horizontal sacrificial layers 118 may have the same thickness as that of the gate electrodes 130. For example, each of the horizontal sacrificial layers 118 may have the same thickness in the Z-direction as that of a gate electrode 130 on the same level.

In the first mold structure KS1, the horizontal sacrificial layers 118 may be disposed on substantially the same level as a level of only a portion of the gate electrodes 130 of the first stack structure GS1. Specifically, in the first mold structure KS1, the horizontal sacrificial layers 118 may be disposed on substantially the same level as a level of a portion of the gate electrodes 130 from a lower portion including a lowermost gate electrode 130. For example, in the first mold structure KS1, the horizontal sacrificial layer 118 may not be disposed on a level corresponding to a level of an uppermost gate electrode 130 of the first stack structure GS1.

The number of stacked horizontal sacrificial layers 118 included in the first mold structure KS1 may be less than the number of stacked gate electrodes 130 included in the first stack structure GS1. For example, when the number of stacked gate electrodes 130 included in the first stack structure GS1 is N (N is a natural number), the number of stacked horizontal sacrificial layers 118 included in the first mold structure KS1 may be N−α (α is a natural number). Here, α may be in the range of about 3% to about 20% of N, but an example embodiment thereof is not limited thereto. For example, a may be 2 to 7.

The first distance D1 between the uppermost gate electrode 130 of the first stack structure GS1 and the lowermost gate electrode 130 of the second stack structure GS2 may be less than the second distance D2 between the uppermost horizontal sacrificial layer 118 of the first mold structure KS1 and the lowermost horizontal sacrificial layer 118 of the second mold structure KS2 in the vertical direction, for example, the Z-direction. Also, the distance D1 between the uppermost gate electrode 130 of the first stack structure GS1 and an upper end of the first channel structure CH1 may be less than the distance D2 between the uppermost horizontal sacrificial layer 118 of the first mold structure KS1 and an upper end of the alignment structure KC in the Z-direction.

When the first mold structure KS1 does not include the horizontal sacrificial layer 118, an etchant may penetrate along interfacial surfaces of the alignment structures KC during the process of forming the recess region RC of the second upper interlayer insulating layer 125B such that defects such as lifting of the alignment structures KC may occur. However, in the example embodiment, since the first mold structure KS1 partially may include the horizontal sacrificial layers 118, such defects may be prevented. Also, when the first mold structure KS1 includes horizontal sacrificial layers 118 up to an upper region of the first mold structure KS1 to correspond to all of the gate electrodes 130 of the first stack structure GS1, when dishing occurs in the second region R2 during a planarization process for the second upper interlayer insulating layer 125B, a depth of the recess region RC of the second upper interlayer insulating layer 125B may not be secured. However, in the example embodiment, since the horizontal sacrificial layer 118 is not disposed in the upper region of the first mold structure KS1, the depth of the recess region RC of the second upper interlayer insulating layer 125B may be secured such that the key pattern portions KP may be clearly formed.

In the second mold structure KS2, the horizontal sacrificial layers 118 may be disposed on substantially the same level as a level of the gate electrodes 130 of the second stack structure GS2 only in partial regions. Specifically, the horizontal sacrificial layers 118 may be disposed on substantially the same level as a level of the gate electrodes 130 on the alignment structures KC and on regions other than the recess region RC of the second upper interlayer insulating layer 125B. In the recess region RC of the second upper interlayer insulating layer 125B, the horizontal sacrificial layers 118 may be disposed on a level lower than a level of corresponding gate electrodes 130 of the second stack structure GS2. For example, in the second mold structure KS2, a level of a lower surface of the lowermost horizontal sacrificial layer 118 may be lower than a level of an upper surface of the uppermost gate electrode 130 of the first stack structure GS1, but an example embodiment thereof is not limited thereto.

The horizontal sacrificial layers 118 may be formed of an insulating material different from that of the interlayer insulating layers 120. The horizontal sacrificial layers 118 may include, for example, silicon oxide, silicon nitride, or silicon oxynitride.

The interlayer insulating layers 120 may be disposed between the gate electrodes 130 in the first region R1 and may be disposed between the horizontal sacrificial layers 118 in the second region R2. For example, in the first region R1, the interlayer insulating layers 120 may be disposed between adjacent gate electrodes 130 and between the lowermost gate electrode 130 and the second horizontal conductive layer 104. In the second region R2, the interlayer insulating layers 120 may be disposed between adjacent horizontal sacrificial layers 118 and between the lowermost horizontal sacrificial layers 118 and the second horizontal conductive layer 104. Similar to the gate electrodes 130 and the horizontal sacrificial layers 118, the interlayer insulating layers 120 may be spaced apart from each other in a direction perpendicular to the upper surface of the substrate 101 and may be disposed to extend lengthwise in the X-direction. The relative thickness and arrangement position of the interlayer insulating layers 120 may be varied in example embodiments.

First and second upper interlayer insulating layers 125A and 125B having a relatively thick thickness may be disposed between the first and second stack structures GS1 and GS2 and between the first and second mold structures KS1 and KS2, respectively. The first and second upper interlayer insulating layers 125A and 125B may have different thicknesses. A thickness of the first upper interlayer insulating layer 125A may be smaller than a thickness of the second upper interlayer insulating layer 125B. In the example embodiment, uppermost surfaces of the first and second upper interlayer insulating layers 125A and 125B may be disposed on the same level, but an example embodiment thereof is not limited thereto.

The interlayer insulating layers 120 and the first and second upper interlayer insulating layers 125A and 125B may include an insulating material such as silicon oxide or silicon nitride.

The channel structures CH may form a memory cell string, and may be spaced apart from each other while forming rows and columns in the first region R1. The channel structures CH may be arranged to form a lattice pattern or may be arranged in a zigzag pattern in one direction on an x-y plane. The channel structures CH may have a columnar shape and may have an inclined side surface having a width decreasing toward the substrate 101 depending on an aspect ratio.

The channel structures CH may include first and second channel structures CH1 and CH2 vertically stacked. The first channel structures CH1 may penetrate through the first stack structure GS1 and may be in contact with the substrate 101, and the second channel structures CH2 may penetrate through the second stack structure GS2 and may be in contact with the first channel structure. Each of the first and second channel structures CH1 and CH2 may have a columnar shape extending in the Z-direction, and may have inclined side surfaces having a width that decreases in a direction toward the substrate 101. The channel structures CH may have a bent portion due to a difference in width in a region in which the first channel structures CH1 and the second channel structures CH2 are connected to each other. However, in example embodiments, the number of channel structures stacked in the Z-direction may be varied.

Each of the channel structures CH may include a gate dielectric layer 145, a channel layer 140, a channel filling insulating layer 150, and a channel pad 155 disposed in order in a channel hole. The channel layer 140, the gate dielectric layer 145, and the channel filling insulating layer 150 may be connected to each other between the first channel structure CH1 and the second channel structure CH2. For example, the channel layer 140, the gate dielectric layer 145, and the channel filling insulating layer 150 of the first channel structure CH1 may be connected to the channel layer 140, the gate dielectric layer 145, and the channel filling insulating layer 150 of the second channel structure CH2 in a region in which the first channel structures CH1 and the second channel structures CH2 are connected to each other.

As illustrated in the enlarged view in FIG. 2, the channel layer 140 may be formed in an annular shape surrounding the internal channel filling insulating layer 150, but in example embodiments, the channel layer 140 may have a column shape such as a cylinder or a prism without the channel filling insulating layer 150. The channel layer 140 may be connected to the first horizontal conductive layer 102 in a lower portion. For example, in a lower portion, the first horizontal conductive layer 102 may contact a sidewall of the channel layer 140. The channel layer 140 may include a semiconductor material such as polycrystalline silicon or single crystal silicon.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The channel pad 155 may be disposed only on the upper end of the upper second channel structure CH2. The channel pad 155 may include, for example, doped polycrystalline silicon.

The alignment structures KC may be disposed in the second region R2, and as illustrated in FIG. 1, may be arranged in a certain pattern within the alignment key regions AK1 and AK2. In example embodiments, each alignment structure KC may extend lengthwise in one of the X- or Y-directions. In the alignment key regions AK1 and AK2, alignment keys for aligning upper and lower patterns during a photolithography process during a process of manufacturing the semiconductor device 100 may be disposed. However, the number of the alignment key regions AK1 and AK2, the shape and size of patterns formed by the alignment structures KC within each of the alignment key regions AK1 and AK2 may be varied in example embodiments. In some example embodiments, only a portion of regions of the alignment key regions AK1 and AK2 may ultimately remain in the semiconductor device 100.

The alignment structures KC may be disposed on substantially the same level as a level of the first channel structures CH1. For example, lower surfaces of the alignment structures KC may be at the same level as lower surfaces of the first channel structures CH1, and upper surfaces of the alignment structure KC may be at the same level as upper surfaces of the first channel structures CH1.

The alignment structures KC may penetrate through the first mold structure KS1 and may be in contact with the substrate 101. In example embodiments, lower surfaces of the alignment structures KC may be at a lower level than an upper surface of the substrate 101. The alignment structures KC may include a vertical sacrificial layer 119. The vertical sacrificial layer 119 may include a carbon-based material. The vertical sacrificial layer 119 may be formed of, for example, an amorphous carbon layer (ACL), but an example embodiment thereof is not limited thereto.

Referring to FIG. 3, the second upper interlayer insulating layer 125 may be partially removed around the alignment structures KC and may have a recess region RC. In the recess region RC, the alignment structures KC may protrude above the upper surface of the second upper interlayer insulating layer 125. The protruded length L1 of the alignment structures KC may range from about 800 Å to about 1200 Å, for example. In example embodiments, the protruded length L1 of the alignment structures KC may be the same as a height in the Z-direction of the recess region RC. The horizontal sacrificial layers 118 and interlayer insulating layers 120 of the second mold structure KS2 may be stacked along the recess region RC and upper regions of the alignment structures KC. The horizontal sacrificial layers 118 and the interlayer insulating layers 120 may have a stepped structure due to the protruding alignment structures KC. A lowermost first horizontal sacrificial layer 118U1 of the second mold structure KS2 may cover a portion of the upper surface and an upper portion of the side surface of the alignment structures KC, may extend along the recess region RC, and may extend along an upper surface of the second upper interlayer insulating layer 125B, which is not recessed. For example, the lowermost first horizontal sacrificial layer 118U1 may contact upper surfaces and upper portions of the side surfaces of the alignment structures KC, and may contact the upper surface of the second upper interlayer insulating layer 125B. In the second mold structure KS2, the plurality of horizontal sacrificial layers 118 may be disposed on a level lower than a level of the upper surfaces or upper ends of the alignment structures KC in the recess region RC. In the example embodiment, the first horizontal sacrificial layer 118U1 and the second horizontal sacrificial layer 118U2 on the first horizontal sacrificial layer 118U1 may be disposed on a level lower than a level of upper surfaces of the alignment structures KC. An upper surface of the second horizontal sacrificial layer 118U2 may be disposed on a level lower than a level of upper surfaces of the alignment structures KC in the recess region RC. However, in example embodiments, the number of horizontal sacrificial layers 118 of the second mold structure KS2 disposed on a level lower than a level of the upper surfaces of the alignment structures KC may be varied. The lowermost surface of the first horizontal sacrificial layer 118U1 may be disposed on a level lower than a level of the upper surface of the uppermost gate electrode 130 of the first stack structure GS1, but an example embodiment thereof is not limited thereto.

The horizontal sacrificial layers 118 and the interlayer insulating layers 120 may be conformally formed on the second horizontal sacrificial layer 118U2, and each may have the key pattern portion KP corresponding to the recess region RC and recessed toward the substrate 101. The key pattern portions KP may be disposed to correspond to the circumferences of alignment structures KC. However, in the horizontal sacrificial layers 118 on the first horizontal sacrificial layer 118U1, the key pattern portions KP may have a gradually gentler shape. As described above, during the process of manufacturing the semiconductor device 100, the key pattern portions KP may function as an alignment key for aligning upper and lower patterns. For example, the key pattern portions KP may function as alignment keys in a process of forming the second channel structures CH2.

The isolation regions MS may penetrate through the first and second stack structures GS1 and GS2 and the first and second horizontal conductive layers 102 and 104 in the first region R1, may extend lengthwise in the X-direction, and may be connected to the substrate 101. In example embodiments, lower surfaces of the isolation regions MS may be at a lower level than an upper surface of the substrate 101. As illustrated in FIG. 1, isolation regions MS may be arranged parallel to each other. The isolation regions MS may separate the gate electrodes 130 from each other in the Y-direction. The isolation regions MS may have a shape in which a width thereof may decrease toward the substrate 101 due to a high aspect ratio. The isolation regions MS may include an isolation insulating layer 105 disposed in the trench. The isolation insulating layer 105 may include an insulating material, for example, silicon oxide, silicon nitride, or silicon oxynitride.

As illustrated in FIG. 1, the upper isolation regions US may extend in the X-direction between isolation regions MS adjacent to each other in the Y-direction in the first region R1. The upper isolation regions US may be disposed to penetrate through a portion of the gate electrodes 130 including the uppermost upper gate electrodes 130S among the gate electrodes 130. As illustrated in FIG. 2, the upper isolation regions US may separate, for example, three gate electrodes 130 from each other in the Y-direction. However, the number of gate electrodes 130 separated from each other by upper isolation regions US may be varied in example embodiments. The upper isolation region US may include an upper isolation insulating layer 103. The upper isolation insulating layer 103 may include an insulating material, for example, silicon oxide, silicon nitride, or silicon oxynitride.

The contact plugs 170 may be disposed on the channel structures CH in the first region R1. The contact plugs 170 may have a cylindrical shape and may have inclined side surfaces such that a width thereof decreases toward the substrate 101 depending on an aspect ratio. The contact plugs 170 may electrically connect the channel structures CH to an upper interconnection structure such as bit lines. The contact plugs 170 may not be disposed in the second region R2. The contact plugs 170 may be formed of a conductive material, and may include, for example, at least one of tungsten (W), aluminum (Al), and copper (Cu).

The cell region insulating layer 190 may be disposed to cover the first and second stack structures GS1 and GS2 and the first and second mold structures KS1 and KS2. The cell region insulating layer 190 may include a plurality of insulating layers in example embodiments. The cell region insulating layer 190 may be formed of an insulating material, and may include, for example, at least one of silicon oxide, silicon nitride, and silicon oxynitride.

Figure 4:
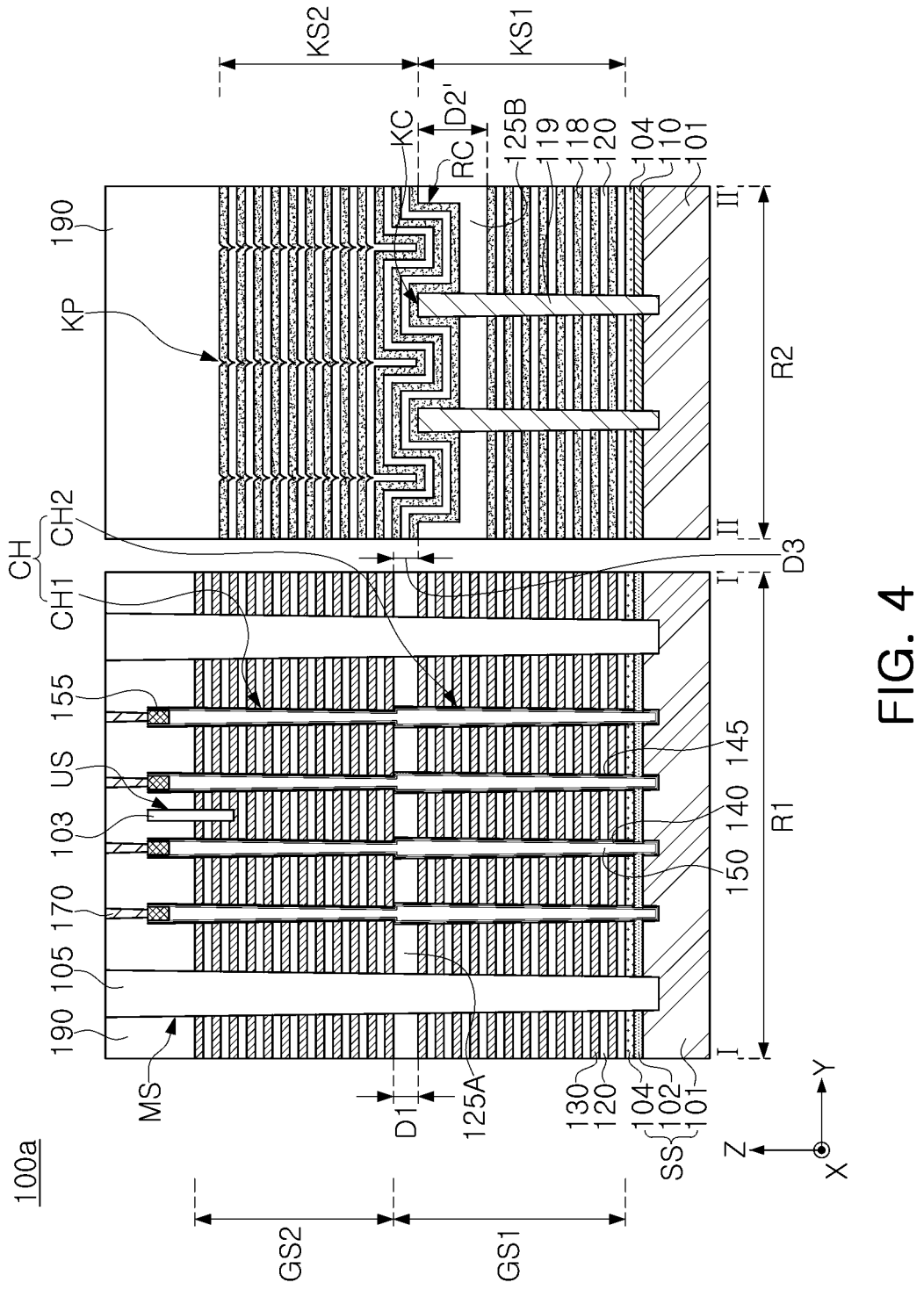
FIGS. 4 to 6 are cross-sectional views illustrating a semiconductor device according to example embodiments of the present disclosure.
Figure 5:
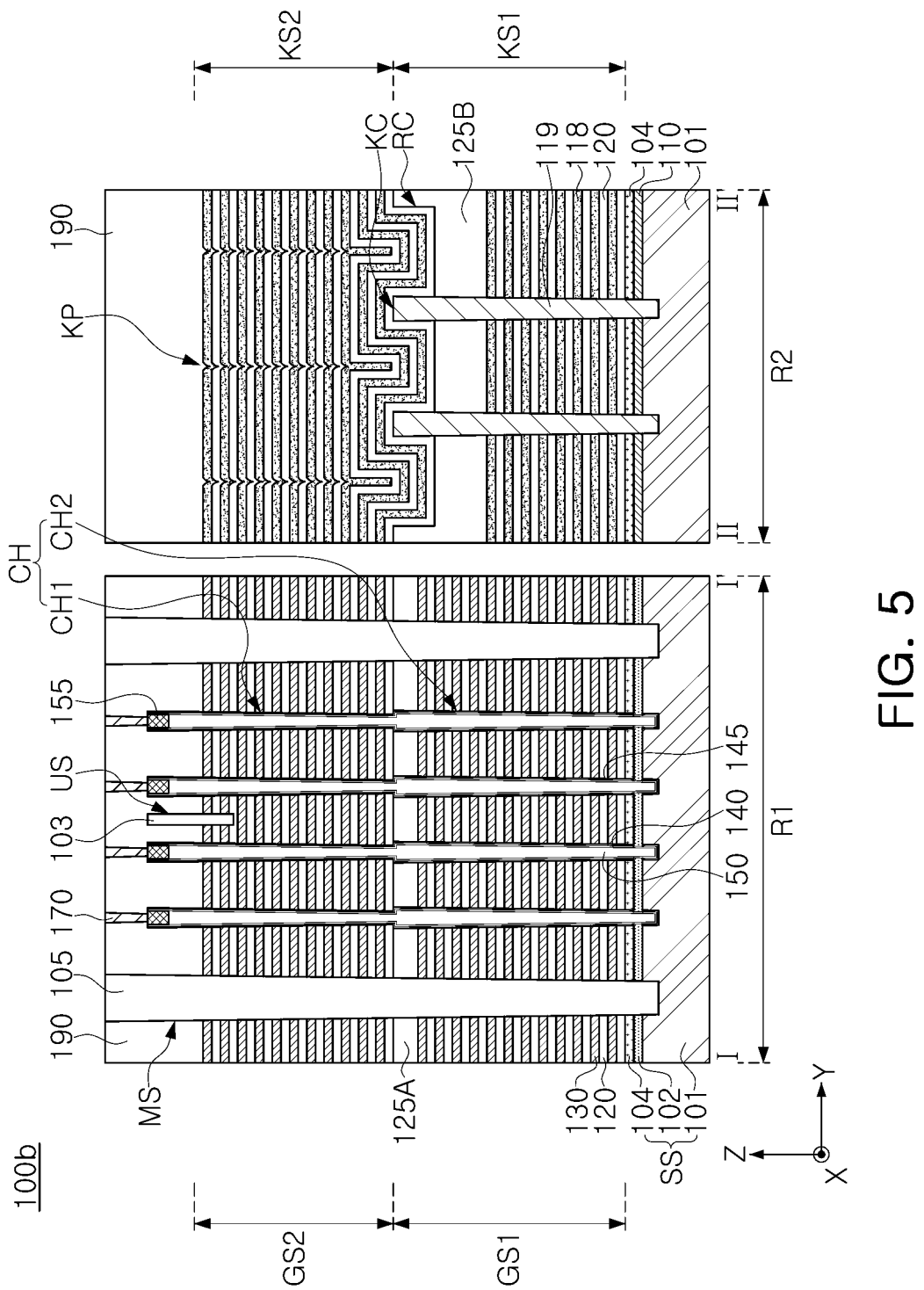
Figure 6:
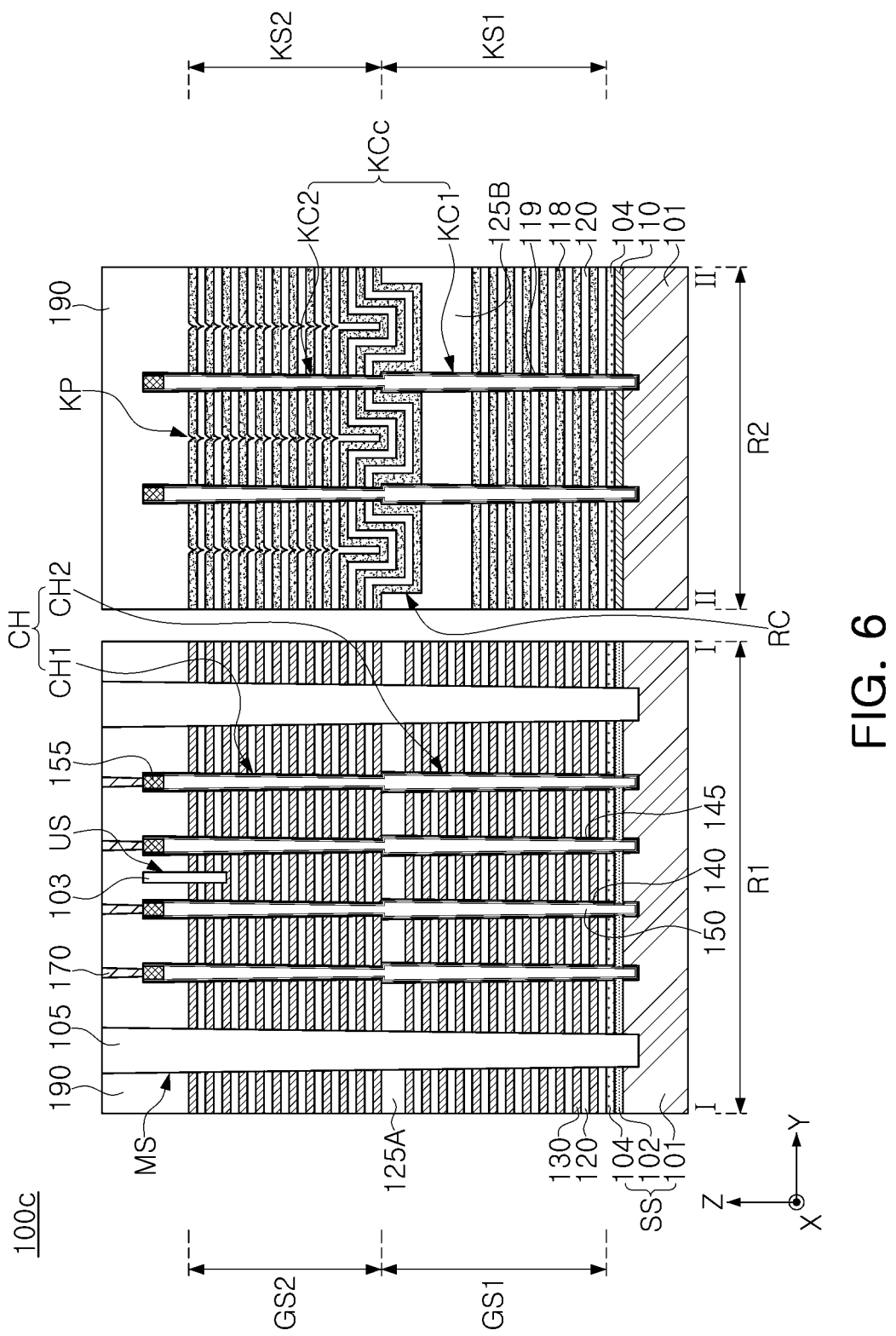

FIGS. 4 to 6 are cross-sectional views illustrating a semiconductor device according to example embodiments.

Referring to FIG. 4, differently from the example embodiments described with reference to FIGS. 1 to 3, in the semiconductor device 100a, upper surfaces of the first and second upper interlayer insulating layers 125A and 125B may be disposed on different levels. An upper surface of the first upper interlayer insulating layer 125A may be disposed on a level higher than a level of an upper surface of the second upper interlayer insulating layer 125B. Accordingly, the gate electrodes 130 of the second stack structure GS2 and the horizontal sacrificial layers 118 of the second mold structure KS2 may also be disposed on different levels.

Such a structure may be formed by dishing in the second region R2 during a planarization process for the first and second upper interlayer insulating layers 125A and 125B. A difference D3 between the level of the upper surface of the first upper interlayer insulating layer 125A and the level of the upper surface of the second upper interlayer insulating layer 125B may be varied in example embodiments. The first distance D1 between the uppermost gate electrode 130 of the first stack structure GS1 and the lowermost gate electrode 130 of the second stack structure GS2 may be less than the second distance D2' between the uppermost horizontal sacrificial layer 118 of the first mold structure KS1 and the lowermost horizontal sacrificial layer 118 of the second mold structure KS2 in the Z-direction.

Referring to FIG. 5, in the semiconductor device 100b, the second stack structure GS2 and the second mold structure KS2 may start with an interlayer insulating layer 120. Accordingly, the interlayer insulating layer 120 may cover the upper surfaces of the alignment structures KC and may cover the recess region RC of the first mold structure KS1. For example, the interlayer insulating layer 120 may contact the upper surfaces of the alignment structures KC and may contact the upper surface of the second upper interlayer insulating layer 125B.

Also in the example embodiment, the plurality of horizontal sacrificial layers 118 may be disposed on a level lower than a level of the upper surfaces or upper ends of the alignment structures KC in the recess region RC of the second upper interlayer insulating layer 125B. However, in some example embodiments, only one horizontal sacrificial layer 118 may be disposed on a level lower than a level of the upper surfaces or upper ends of the alignment structures KC.

Referring to FIG. 6, in the semiconductor device 100c, each of the alignment structures KCc may include vertically stacked first and second alignment structures KC1 and KC2.

The first alignment structure KC1 may penetrate through the first mold structure KS1 and may be in contact with the substrate 101, and the second alignment structure KC2 may penetrate through the second mold structure KS2 and may be connected to the first alignment structure KC1. The alignment structure KCc may have a bent portion due to a difference in width in a region in which the first alignment structure KC1 and the second alignment structure KC2 are connected to each other.

The alignment structure KCc may have the same internal structure as the channel structure CH. The same internal structure may indicate that the types of the layers disposed therein and the stacking order thereof may be the same. Accordingly, the alignment structure KCc may include a gate dielectric layer 145, a channel layer 140, a channel filling insulating layer 150, and a channel pad 155 disposed in order in the opening. However, differently from the channel structure CH, the alignment structures KCc may not receive an electrical signal through the contact plug 170 and may not form a memory cell string, and may be thus referred to as a dummy channel structure. In the example embodiment, in addition to the key pattern portions KP, the alignment structure KCc may also function as an alignment key during the process of manufacturing the semiconductor device 100.

Figure 7:
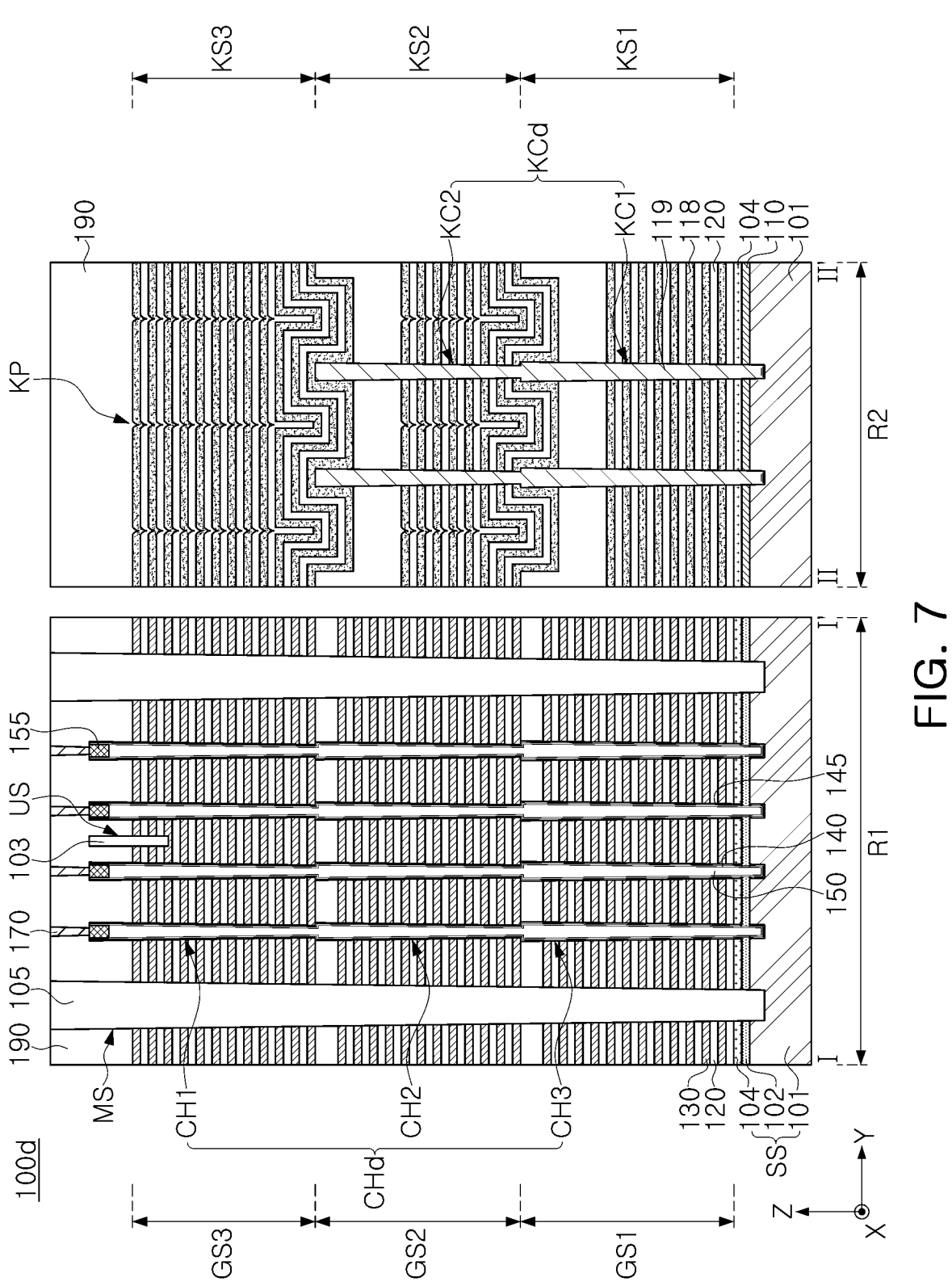
FIG. 7 is a cross-sectional view illustrating a semiconductor device according to an example embodiment of the present disclosure.

FIG. 7 is a cross-sectional view illustrating a semiconductor device according to an example embodiment.

Referring to FIG. 7, the semiconductor device 100d may further include a third stack structure GS3 and a third mold structure KS3. The channel structure CHd may further include a third channel structure CH3, and the alignment structure KCd may further include a second alignment structure KC2. The second mold structure KS2 and the third mold structure KS3 may have key pattern portions KP.

In the channel structure CHd, the third channel structure CH3 may be connected to the second channel structure CH2 and may include a channel pad 155 disposed on an upper end. In the alignment structure KCd, the second alignment structure KC2 may be connected to the first alignment structure KC1. The description of the key pattern portions KP described in the aforementioned example embodiment with reference to FIGS. 1 to 3 may be applied to the descriptions of the first key pattern portion KP1 and the second key pattern portion KP2.

In example embodiments, the number of the stack structures and the mold structures stacked in the Z-direction may be varied as described above, and accordingly, the shape of the alignment structure KCd may also be varied. In some example embodiments, the second alignment structures KC2 may not be provided, and in this case, the key pattern portions KP of the third mold structure KS3 may be formed or may not be formed.

Figure 8:
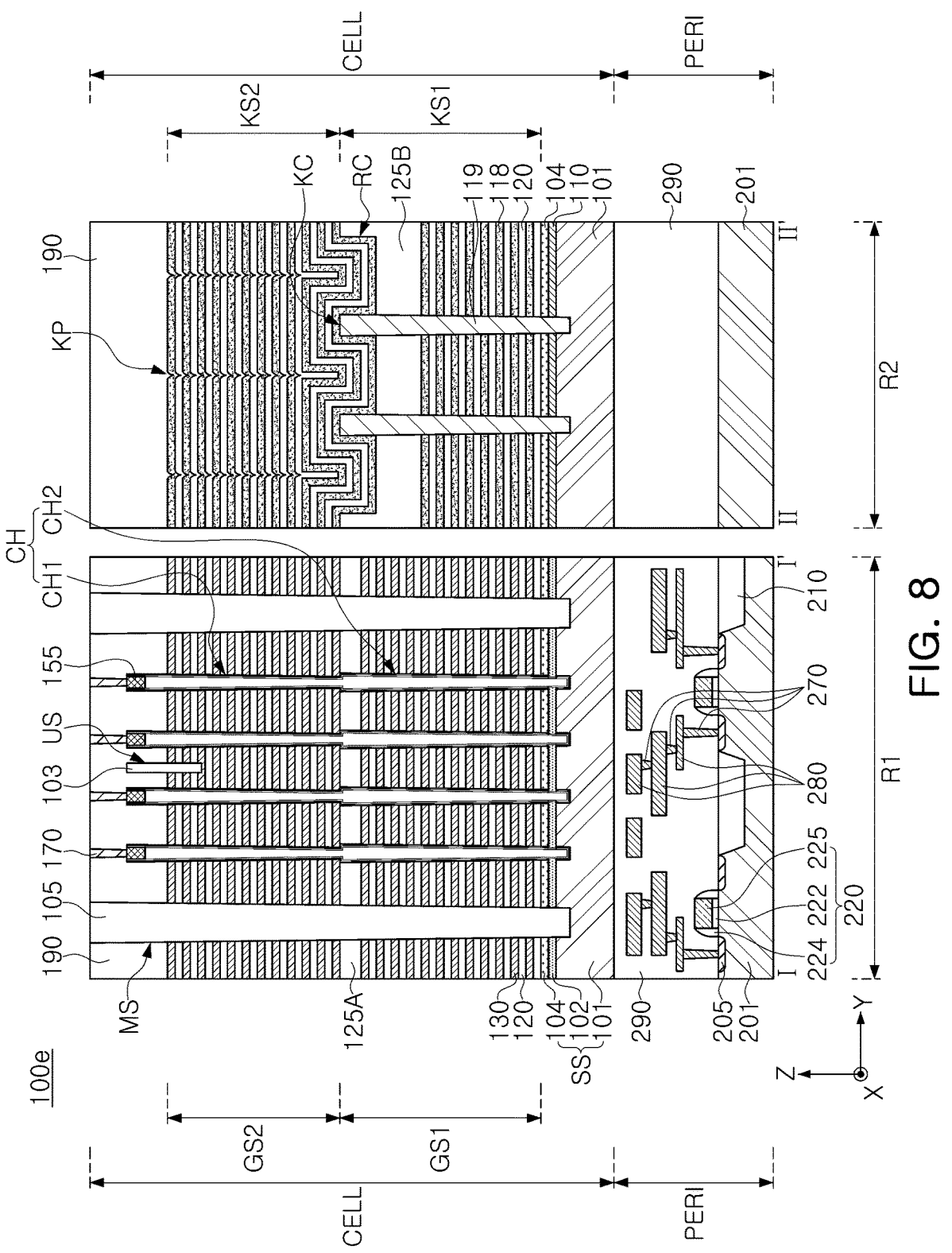
FIG. 8 is a cross-sectional view illustrating a semiconductor device according to an example embodiment of the present disclosure.

FIG. 8 is a cross-sectional view illustrating a semiconductor device according to an example embodiment.

Referring to FIG. 8, the semiconductor device 100e may include vertically stacked memory cell regions CELL and peripheral circuit regions PERI. A memory cell region CELL may be disposed on a peripheral circuit region PERI. For example, in the case of the semiconductor device 100 in FIG. 2, a peripheral circuit region PERI may be disposed on the substrate 101 in a region not illustrated, or as in the semiconductor device 100e in the example embodiment, a peripheral circuit region PERI may be disposed therebelow. In example embodiments, the cell region CELL may be disposed on a peripheral circuit region PERI. The description with reference to FIGS. 1 to 3 may be applied to the description of the memory cell region CELL.

The peripheral circuit region PERI may include a base substrate 201, circuit devices 220, circuit contact plugs 270, and circuit interconnection lines 280 disposed on the base substrate 201.

The base substrate 201 may have an upper surface extending in the X- and Y-directions. In the base substrate 201, device isolation layers 210 may be formed and an active region may be defined. Source/drain regions 205 including impurities may be disposed in a portion of the active region. The base substrate 201 may include a semiconductor material, for example, a group IV semiconductor, a group III-V compound semiconductor, or a group II-VI compound semiconductor. The base substrate 201 may be provided as a bulk wafer or an epitaxial layer. In the example embodiment, the upper substrate 101 may be provided as a polycrystalline semiconductor layer such as a polycrystalline silicon layer or an epitaxial layer.

The circuit devices 220 may include planar transistors. Each circuit device 220 may include a circuit gate dielectric layer 222, a spacer layer 224, and a circuit gate electrode 225. The source/drain regions 205 may be disposed in the base substrate 201 on both sides of the circuit gate electrode 225.

A peripheral region insulating layer 290 may be disposed on the circuit device 220 on the base substrate 201. The circuit contact plugs 270 may penetrate through the peripheral region insulating layer 290 and may be connected to the source/drain regions 205. Electrical signals may be applied to the circuit device 220 by the circuit contact plugs 270. In a region not illustrated, circuit contact plugs 270 may also be connected to the circuit gate electrode 225. The circuit interconnection lines 280 may be connected to the circuit contact plugs 270 and may be arranged in a plurality of layers. In the peripheral circuit region PERI, the circuit device 220, the circuit contact plugs 270, and the circuit interconnection lines 280 may not be disposed below the second region R2, but an example embodiment thereof is not limited thereto.

The memory cell region CELL and the peripheral circuit region PERI may be electrically connected to each other in regions not illustrated. For example, one end of the gate electrode 130 in the X-direction may be electrically connected to the circuit devices 220. The memory cell region CELL and the peripheral circuit region PERI vertically stacked as described above may also be applied to the example embodiments described with reference to FIGS. 1 to 7.

Figure 9A:
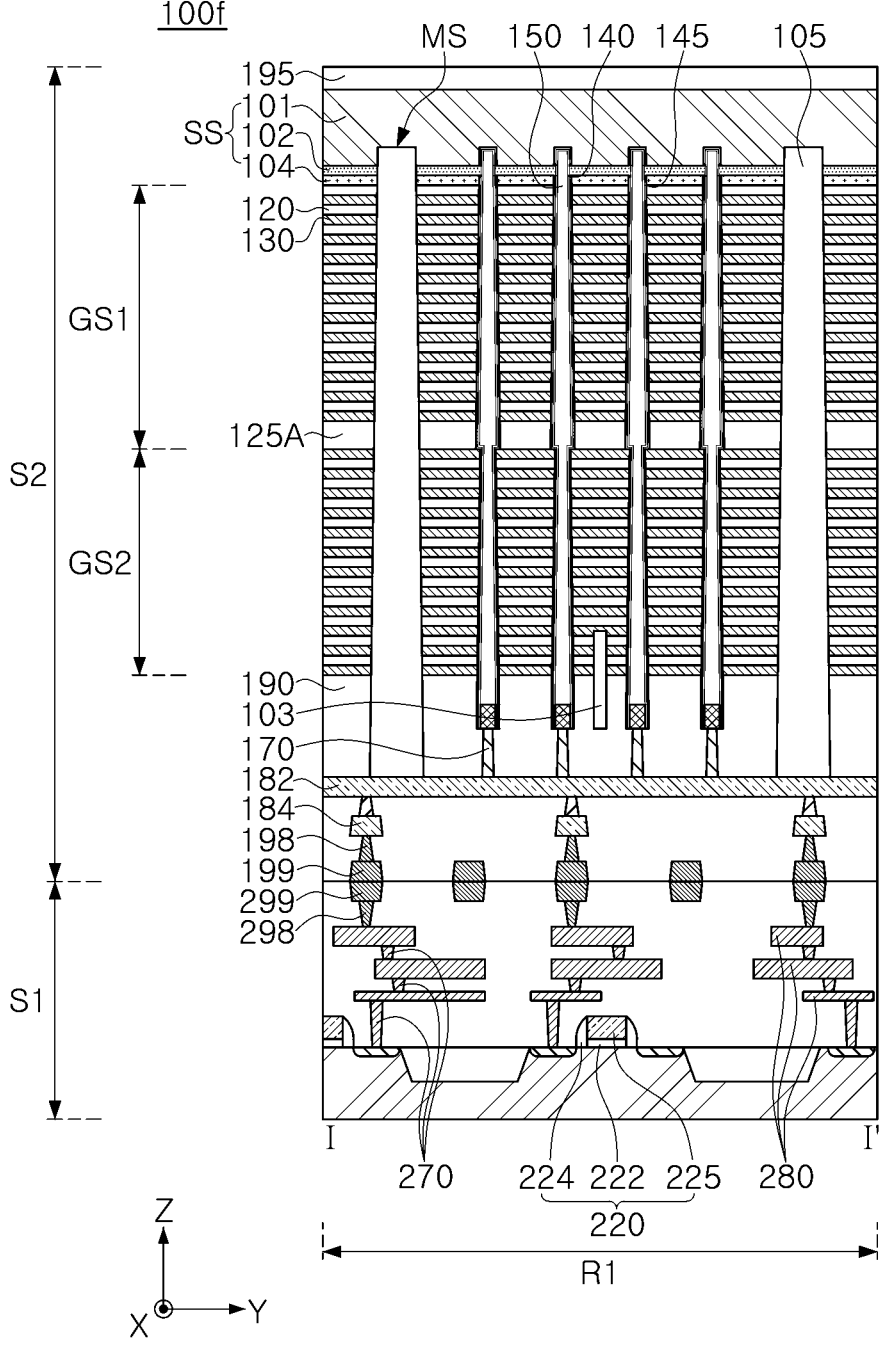
FIGS. 9A and 9B are cross-sectional views illustrating a semiconductor device according to an example embodiment of the present disclosure.
Figure 9B:
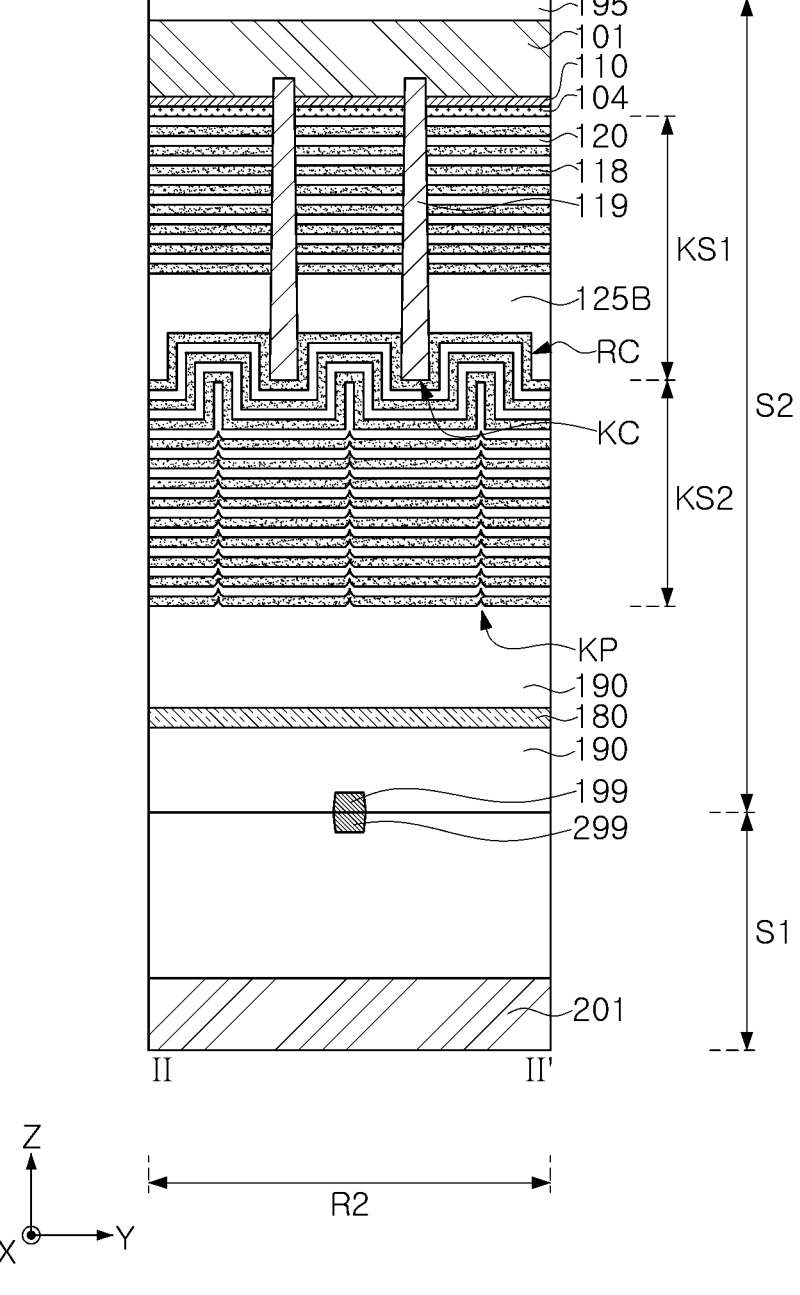

FIGS. 9A and 9B are cross-sectional views illustrating a semiconductor device according to an example embodiment.

Referring to FIGS. 9A and 9B, a semiconductor device 100f may include a first semiconductor structure S1 and a second semiconductor structure S2 bonded by a wafer bonding method.

The description of the peripheral circuit region PERI described in the aforementioned example embodiment with reference to FIG. 8 may be applied to the first semiconductor structure S1. However, the first semiconductor structure S1 may further include first bonding vias 298 and first bonding pads 299 which may be bonding structures. The first bonding vias 298 may be disposed above the uppermost circuit interconnection lines 280 and may be connected to the circuit interconnection lines 280. At least a portion of the first bonding pads 299 may be connected to the first bonding vias 298 on the first bonding vias 298. The first bonding pads 299 may be connected to the second bonding pads 199 of the second semiconductor structure S2. The first bonding pads 299 may, together with the second bonding pads 199, provide an electrical connection path according to bonding between the first semiconductor structure S1 and the second semiconductor structure S2. The first bonding vias 298 and the first bonding pads 299 may include a conductive material, such as copper (Cu).

The description described with reference to FIGS. 1 to 3 may be applied to the second semiconductor structure S2, unless otherwise indicated. The second semiconductor structure S2 may further include lower contact plugs 174 and first and second cell interconnection lines 182 and 184, which may be an interconnection structure, and may further include second bonding vias 198 and second bonding pads 199 which may be a bonding structure. The second semiconductor structure S2 may further include a passivation layer 195 covering an upper surface of the substrate 101.

The first cell interconnection lines 182 may be connected to the contact plugs 170, and the second cell interconnection lines 184 may be electrically connected to the first cell interconnection lines 182 by the lower contact plugs 174. The lower contact plugs 174 may be disposed between the first and second cell interconnection lines 182 and 184 and may connect the first and second cell interconnection lines 182 and 184 to each other. However, in example embodiments, the number of layers of the contact plugs and the interconnection lines included in the interconnection structure and the arrangement form thereof may be varied. The lower contact plugs 174 and the first and second cell interconnection lines 182 and 184 may be formed of a conductive material, for example, at least one of tungsten (W), aluminum (Al), and copper (Cu).

The second bonding vias 198 and the second bonding pads 199 may be disposed below the lowermost second cell interconnection lines 184. The second bonding vias 198 may be connected to the second cell interconnection lines 184 and the second bonding pads 199, and the second bonding pads 199 may be bonded to the first bonding pads 299 of the first semiconductor structure S1. The second bonding vias 198 and the second bonding pads 199 may include a conductive material, such as copper (Cu).

The first semiconductor structure S1 and the second semiconductor structure S2 may be bonded to each other by copper (Cu)-copper (Cu) bonding by the first bonding pads 299 and the second bonding pads 199. In addition to the copper (Cu)-copper (Cu) bonding, the first semiconductor structure S1 and the second semiconductor structure S2 may further be bonded by dielectric-dielectric bonding. The dielectric-dielectric bonding may be bonding by dielectric layers forming a portion of each of the peripheral region insulating layer 290 and the cell region insulating layer 190 and surrounding the first bonding pads 299 and the second bonding pads 199, respectively. Accordingly, the first semiconductor structure S1 and the second semiconductor structure S2 may be bonded without an adhesive layer.

FIGS. 10A to 10G are cross-sectional views illustrating a method of manufacturing a semiconductor device according to an example embodiment, illustrating a cross-section corresponding to FIG. 2.

Figure 10A:
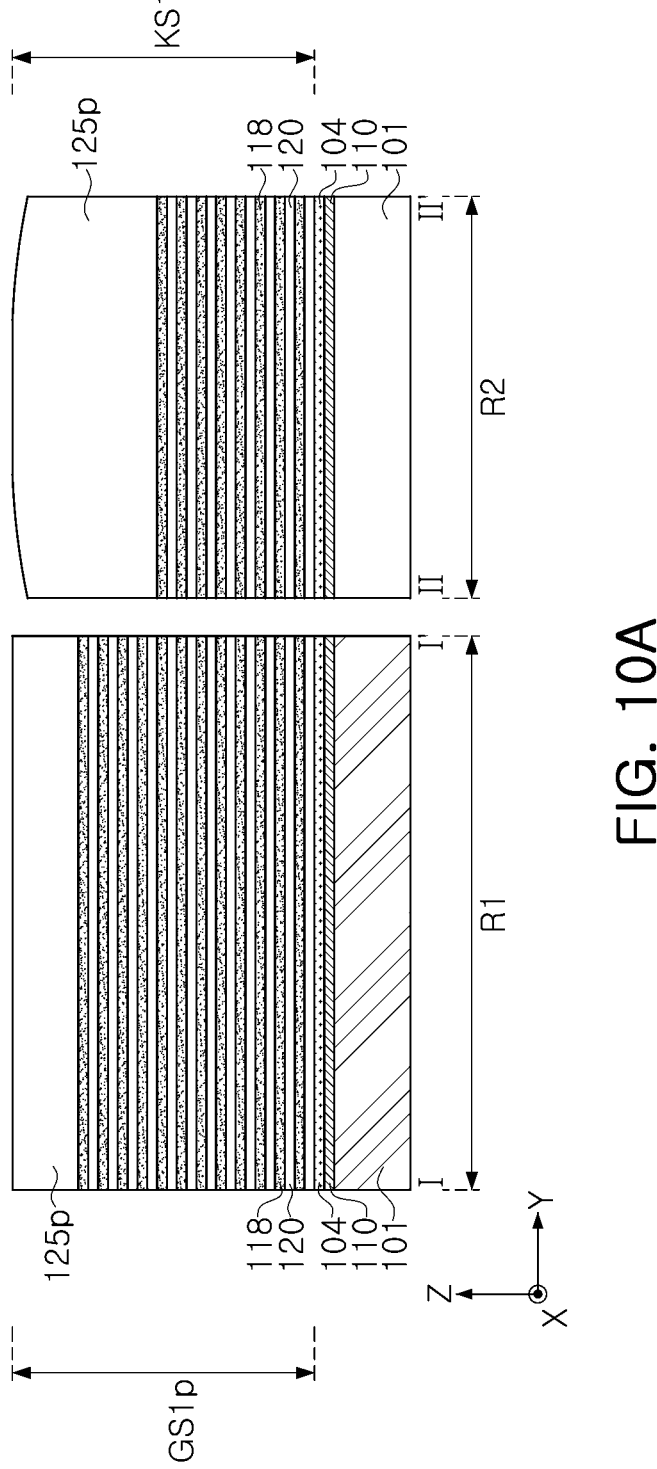
FIGS. 10A to 10G are cross-sectional views illustrating a method of manufacturing a semiconductor device according to an example embodiment of the present disclosure.

Referring to FIG. 10A, a horizontal insulating layer 110 and a second horizontal conductive layer 104 may be formed on a substrate 101, and a first preliminary stack structure GS1*p* and a first mold structure KS1 may be formed by alternately stacking the horizontal sacrificial layers 118 and the interlayer insulating layers 120.

The substrate 101 may have a first region R1 on which memory cells are formed and a second region R2 on an external side of the first region R1. After the same process is performed on the first and second regions R1 and R2, a plurality of horizontal sacrificial layers 118 and a plurality of interlayer insulating layers 120 may be removed from the upper portion only in the second region R2.

The horizontal insulating layer 110 may include a plurality of layers including different materials. The horizontal insulating layer 110 may be replaced with the first horizontal conductive layer 102 (see FIG. 2) through a subsequent process. For example, the horizontal insulating layer 110 may include a first layer and a third layer formed of the same material as that of the interlayer insulating layers 120, and may further include a second layer formed of the same material as that of the horizontal sacrificial layers 118 and disposed between the first layer and the third layer. The second horizontal conductive layer 104 may be formed on the horizontal insulating layer 110.

The horizontal sacrificial layers 118 may be replaced with the gate electrodes 130 (see FIG. 2) in the first region R1 through a subsequent process in the first preliminary stack structure GS1*p*. The horizontal sacrificial layers 118 may be formed of a material different from that of the interlayer insulating layers 120, and may be formed of a material which may be etched with etch selectivity under specific etching conditions with respect to the interlayer insulating layers 120. For example, the interlayer insulating layer 120 may be formed of at least one of silicon oxide and silicon nitride, and the horizontal sacrificial layers 118 may be formed of a material different from that of the interlayer insulating layer 120, selected from silicon, silicon oxide, silicon carbide, and silicon nitride. In example embodiments, the interlayer insulating layers 120 may not have the same thickness. In example embodiments, the thickness of the interlayer insulating layers 120 and the horizontal sacrificial layers 118 and the number of layers thereof may be varied from the illustrated examples.

The first preliminary stack structure GS1*p* may be formed on the first and second regions R1 and R2, and the second region R2 may be open using a mask layer. The horizontal sacrificial layers 118 and the interlayer insulating layers 120 may be partially removed from the upper portion only in the second region R2. Accordingly, the first mold structure KS1 may be formed in the second region R2.

A preliminary upper interlayer insulating layer 125*p* having a relatively thick thickness may be formed on the uppermost horizontal sacrificial layer 118. Since the number of horizontal sacrificial layers 118 is relatively small in the second region R2, the upper surface of the preliminary upper interlayer insulating layer 125*p* may be disposed on a relatively low level in at least a portion of regions, but an example embodiment thereof is not limited thereto.

Figure 10B:
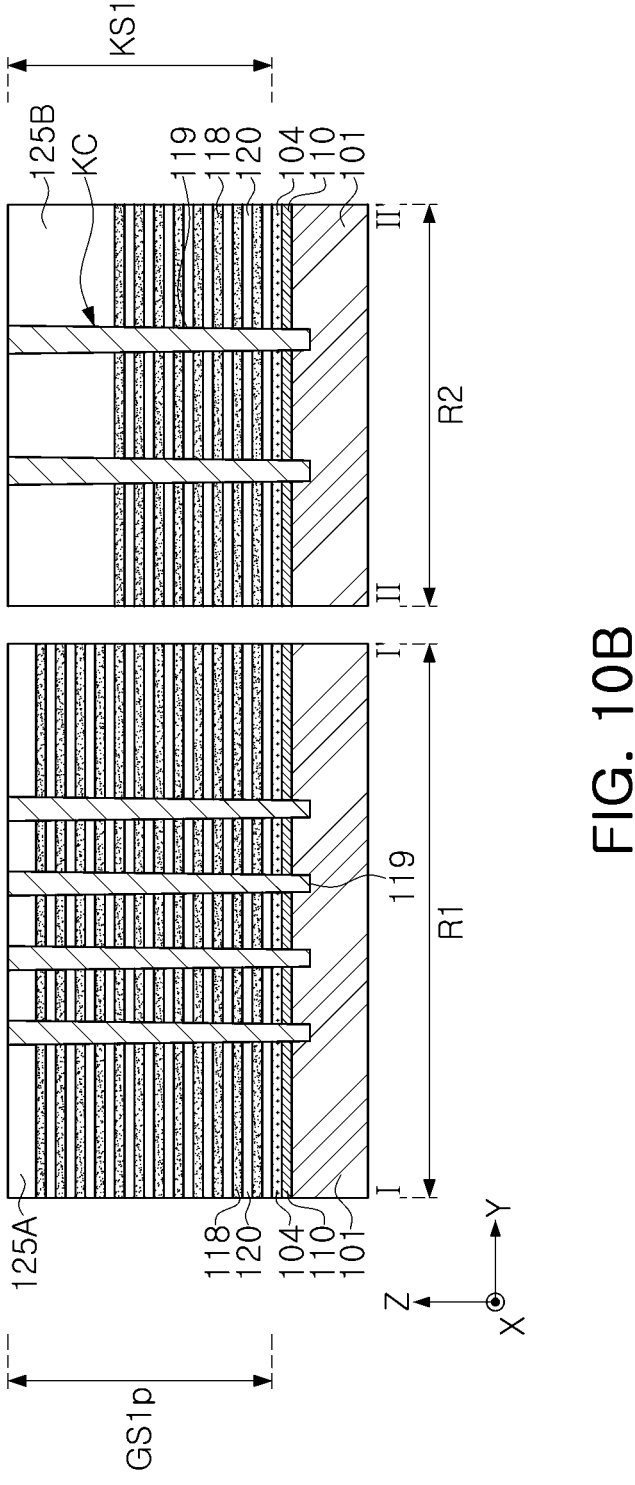

Referring to FIG. 10B, first and second upper interlayer insulating layers 125A and 125B may be formed, and vertical sacrificial layers 119 penetrating through the first preliminary stack structure GS1*p* and the first mold structure KS1 may be formed.

A portion of the preliminary upper interlayer insulating layer 125*p* may be removed by a planarization process, and first and second upper interlayer insulating layers 125A and 125B may be formed. In some example embodiments, density of the first mold structure KS1 in the second region R2 and the surrounding region thereof may be relatively lower than in the first region R1, and accordingly, dishing may occur in the second region R2. In this case, as in the example embodiment described with reference to FIG. 4, levels of upper surfaces of the first and second upper interlayer insulating layers 125A and 125B may be different.

The vertical sacrificial layers 119 may be formed in regions corresponding to the first channel structures CH1 and alignment structures KC in FIG. 2, and may form the alignment structures KC in the second region R2. The vertical sacrificial layers 119 may be formed by forming lower channel holes to penetrate through the first preliminary stack structure GS1*p* and the first mold structure KS1, depositing a material forming the vertical sacrificial layers 119 in the lower channel holes and performing a planarization process. The vertical sacrificial layers 119 may include a carbon-based material. However, in example embodiments, the vertical sacrificial layers 119 may include a semiconductor material such as polycrystalline silicon or a silicon-based insulating material.

Figure 10C:
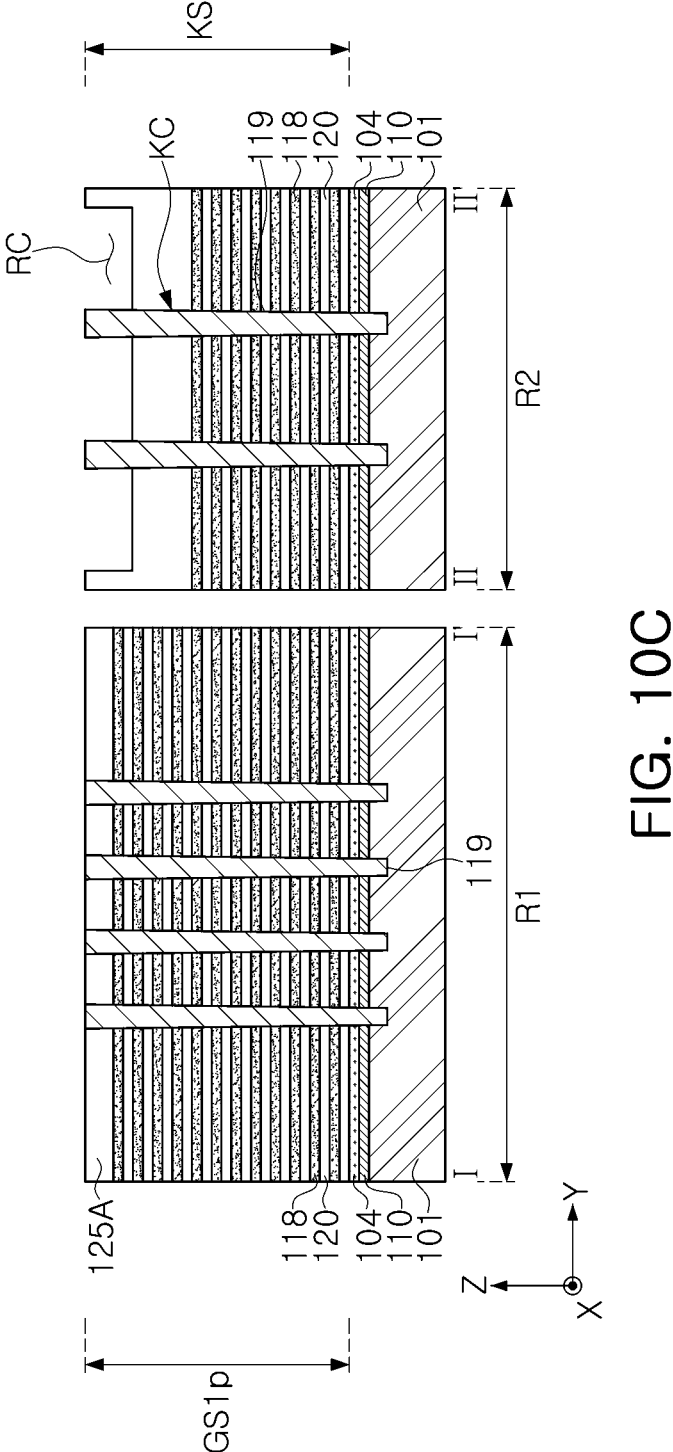

Referring to FIG. 10C, a recess region RC may be formed by partially removing the first mold structure KS1 to expose the vertical sacrificial layers 119 in the second region R2.

The recess region RC may be formed by removing the second upper interlayer insulating layer 125B from the upper surface to a predetermined depth in the second region R2 such that upper ends of the vertical sacrificial layers 119 may be exposed. The etching process may be performed after exposing a region including the vertical sacrificial layers 119 using a mask layer. The etching process may be, for example, a wet etching process. Accordingly, the first mold structure KS1 may be partially recessed such that a recess region RC may be formed, and the vertical sacrificial layers 119 may protrude from the upper surface of the second upper interlayer insulating layer 125B in the recess region RC. The recess region RC may refer to a region around the vertical sacrificial layers 119 in the second region R2. In example embodiments, the width and depth of the recess region RC along the circumference of the vertical sacrificial layers 119 may be varied.

Adhesion between the horizontal sacrificial layers 118 and the vertical sacrificial layers 119 may be stronger than adhesion between the interlayer insulating layers 120 and the vertical sacrificial layers 119. Since the first mold structure KS1 partially includes the horizontal sacrificial layers 118, a defect in which the vertical sacrificial layers 119 are lifted by an etchant penetrating along the interfacial surface of the vertical sacrificial layers 119 may be prevented during the wet etching process. Also, since the horizontal sacrificial layers 118 are not disposed in the upper region of the first mold structure KS1, the depth of the recess region RC may be secured.

Figure 10D:
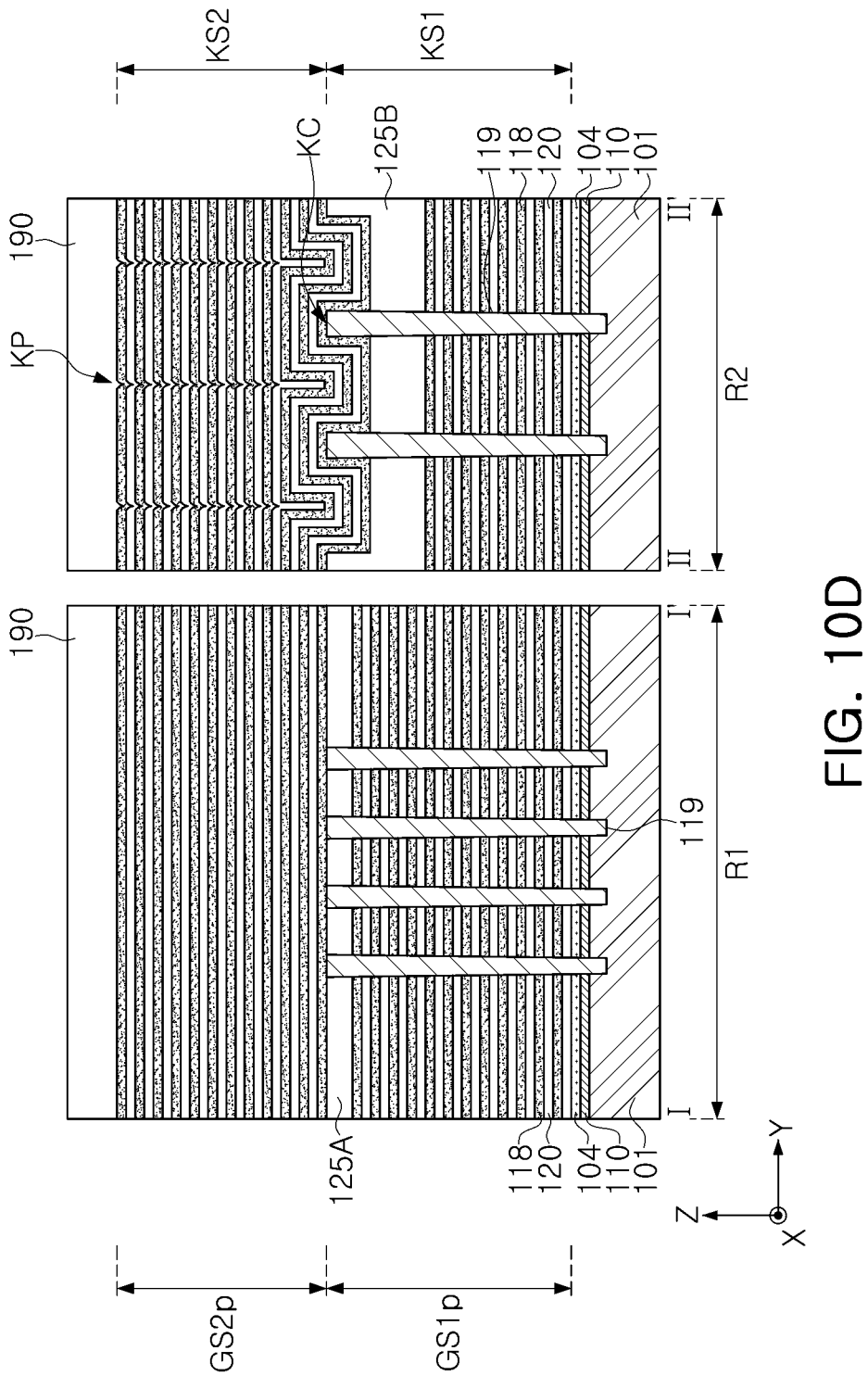

Referring to FIG. 10D, a second preliminary stack structure GS2p and a second mold structure KS2 may be formed by alternately stacking the horizontal sacrificial layers 118 and the interlayer insulating layers 120.

Similarly to the first preliminary stack structure GS1p and the first mold structure KS1, the second preliminary stack structure GS2p and the second mold structure KS2 may be formed by alternately stacking the horizontal sacrificial layers 118 and interlayer insulating layers 120. In the second region R2, a stepped difference may be formed by the recessed region of the first mold structure KS1, and the depth of the stepped difference may be reduced upwardly. Accordingly, notch portions may be formed in upper layers of the horizontal sacrificial layers 118 and the interlayer insulating layers 120 including uppermost layers. The stepped differences and the notch portions may form key pattern portions KP. The key pattern portions KP may be formed to correspond to regions between the vertical sacrificial layers 119.

A portion of the cell region insulating layer 190 may be formed on the second preliminary stack structure GS2p and the second mold structure KS2. The cell region insulating layer 190 may also have the notch portion forming the key pattern portion KP on an upper surface. In example embodiments, a portion of the cell region insulating layer 190 formed in this process may be described as an interlayer insulating layer 120 included in the second preliminary stack structure GS2p and the second mold structure KS2.

Figure 10E:
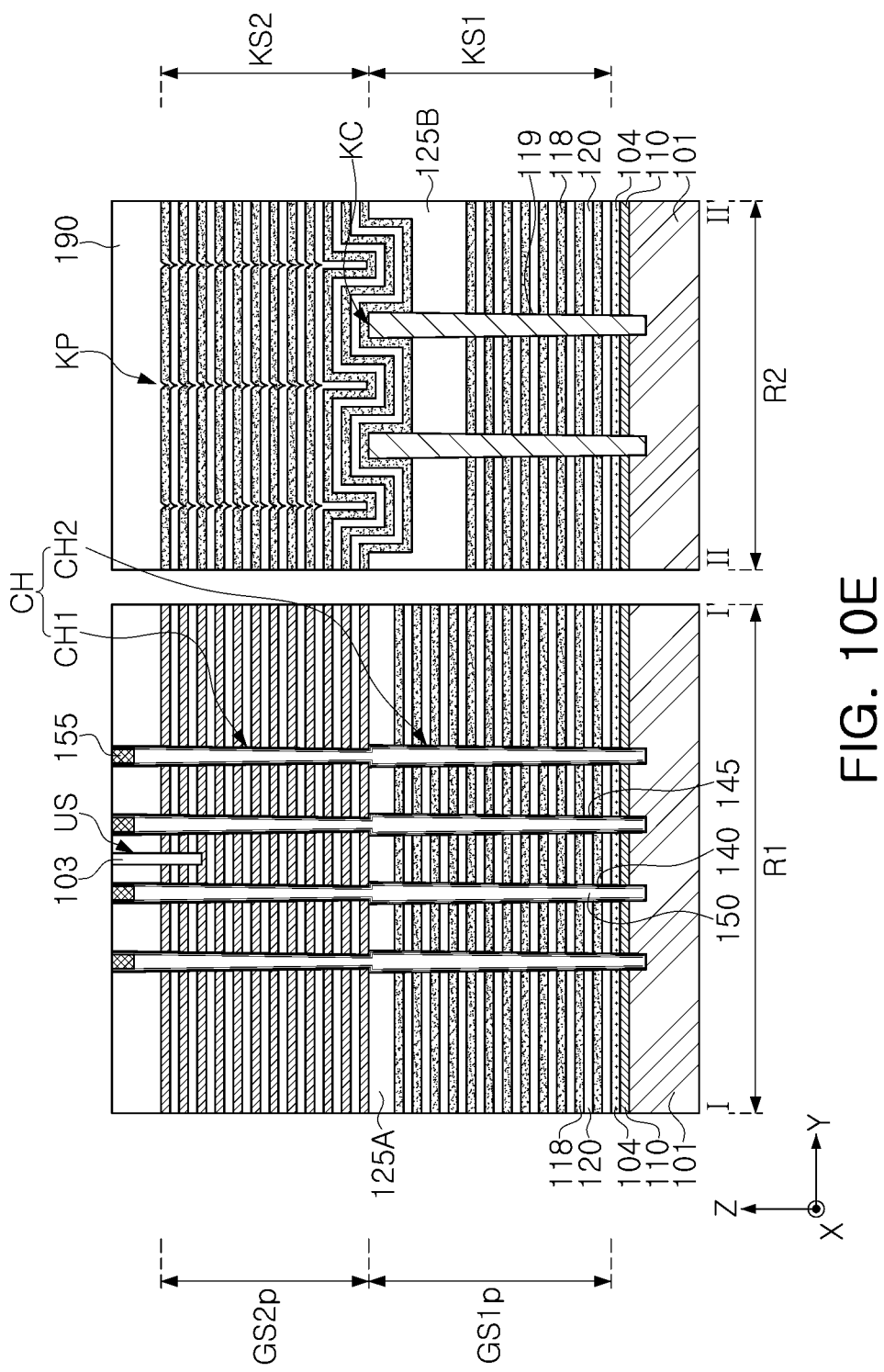

Referring to FIG. 10E, upper channel holes penetrating through the second preliminary stack structure GS2p in the first region R1 may be formed, vertical sacrificial layers 119 exposed through the upper channel holes may be removed, and channel structures CH may be formed.

An upper isolation region US may be formed by removing a portion of the second preliminary stack structure GS2p. To form the upper isolation region US, a region in which the upper isolation region US is formed may be exposed using a separate mask layer, a predetermined number of horizontal sacrificial layers 118 and interlayer insulating layers 120 may be formed from an uppermost portion, and by depositing an insulating material, an upper isolation insulating layer 103 may be formed.

Thereafter, the upper channel holes may be formed in the vertical sacrificial layers 119 to expose upper surfaces of the vertical sacrificial layers 119. In this process, during a photolithography process for forming the upper channel holes, a key pattern portion KP may function as an alignment key. Even in subsequent processes, the key pattern portion KP may further function as an alignment key. In example embodiments, when the process of forming the upper channel holes and the process of forming the channel structures CH are not continuously performed, a process of filling the upper channel holes with vertical sacrificial layers may be further performed.

Thereafter, the channel structures CH may be formed by forming channel holes by removing the vertical sacrificial layers 119 and filling the channel holes. Specifically, the channel structures CH may be formed by forming a gate dielectric layer 145, a channel layer 140, a channel filling insulating layer 150, and channel pads 155 in the channel holes in order. The channel layer 140 may be formed on the gate dielectric layer 145 within the channel structures CH. The channel filling insulating layer 150 may be formed to fill the channel structures CH and may be an insulating material. However, in example embodiments, the space between the channel layers 140 may be filled with a conductive material instead of the channel filling insulating layer 150. The channel pads 155 may be formed of a conductive material, for example polycrystalline silicon. Accordingly, the channel structures CH including the first channel structure CH1 in the first preliminary stack structure GS1p and the second channel structure CH2 in the second preliminary stack structure GS2p may be formed.

The example embodiment described with reference to FIG. 6 may be formed by forming the alignment structures KCc in the second region R2 together with the channel structures CH in this process.

Figure 10F:
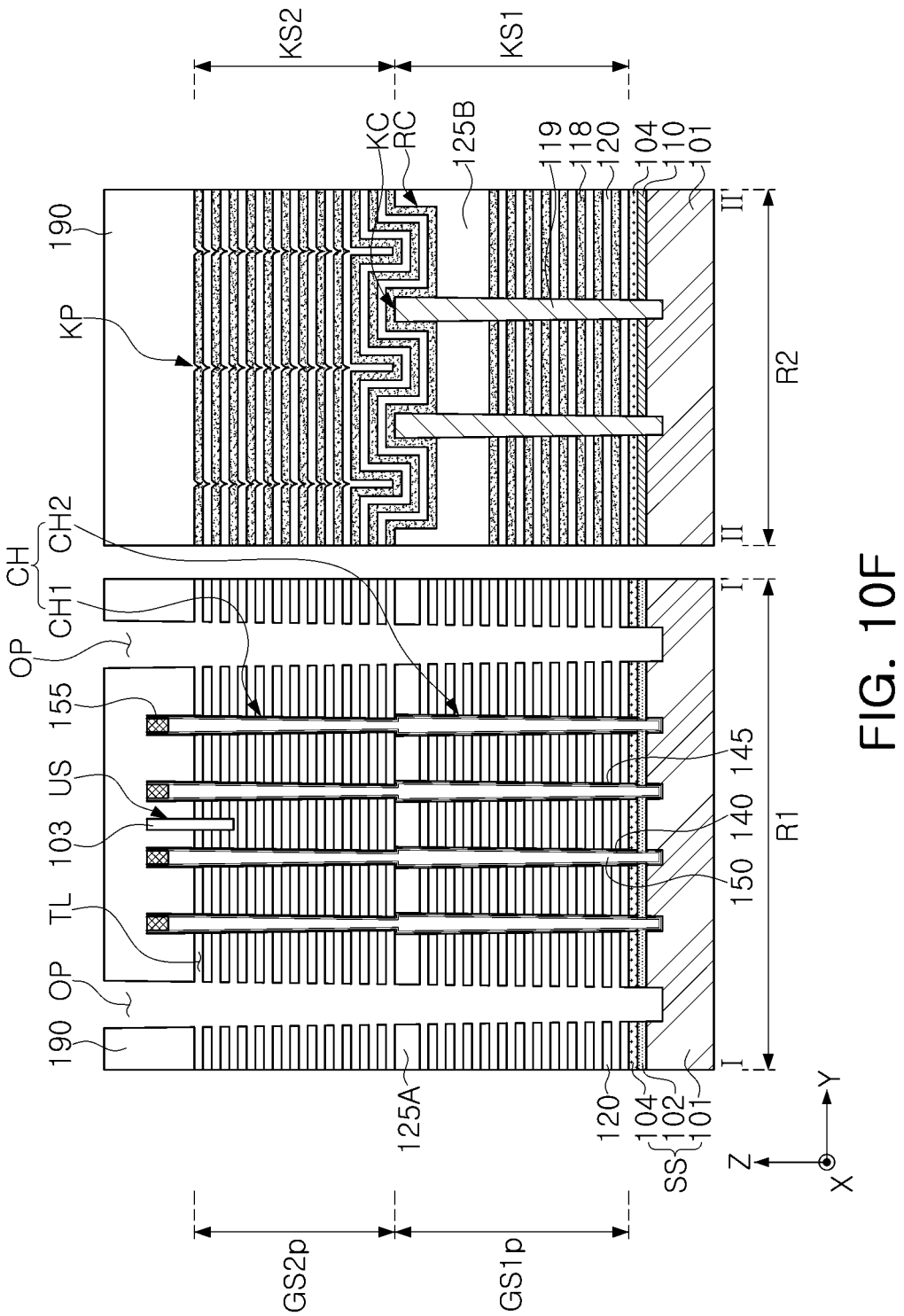

Referring to FIG. 10F, openings OP penetrating through the first and second preliminary stack structures GS1p and GS2p and extending to the substrate 101 may be formed in the first region R1, the first horizontal conductive layer 102 may be formed, and the horizontal sacrificial layers 118 may be removed.

A cell region insulating layer 190 may be further formed, and openings OP may be formed in positions corresponding to the isolation regions MS (see FIG. 1) in the first region R1. Thereafter, an etch-back process may be performed while forming sacrificial spacer layers in the openings OP, thereby exposing the horizontal insulating layer 110 in the first region R1, and a horizontal insulating layer 110 may be removed from the exposed region. The horizontal insulating layer 110 may be removed by, for example, a wet etching process. During the process of removing the horizontal insulating layer 110, a portion of the gate dielectric layer 145 exposed in the region from which the horizontal insulating layer 110 is removed may also be removed. In the first region R1, the first horizontal conductive layer 102 may be formed by depositing a conductive material in the region from which the horizontal insulating layer 110 is removed, and the sacrificial spacer layers may be removed from the openings OP. By this process, a first horizontal conductive layer 102 may be formed in the first region R1, and a source structure SS including the substrate 101 and the first and second horizontal conductive layers 102 and 104 may be formed.

Thereafter, the horizontal sacrificial layers 118 may be selectively removed with respect to the interlayer insulating layers 120, the upper interlayer insulating layer 125, a protective layer 160, and a second horizontal conductive layer 104 using, for example, wet etching, and accordingly, tunnel portions TL may be formed. In this process, since the openings OP are not formed in the second region R2, the horizontal insulating layer 110 and the horizontal sacrificial layers 118 may remain.

Figure 10G:
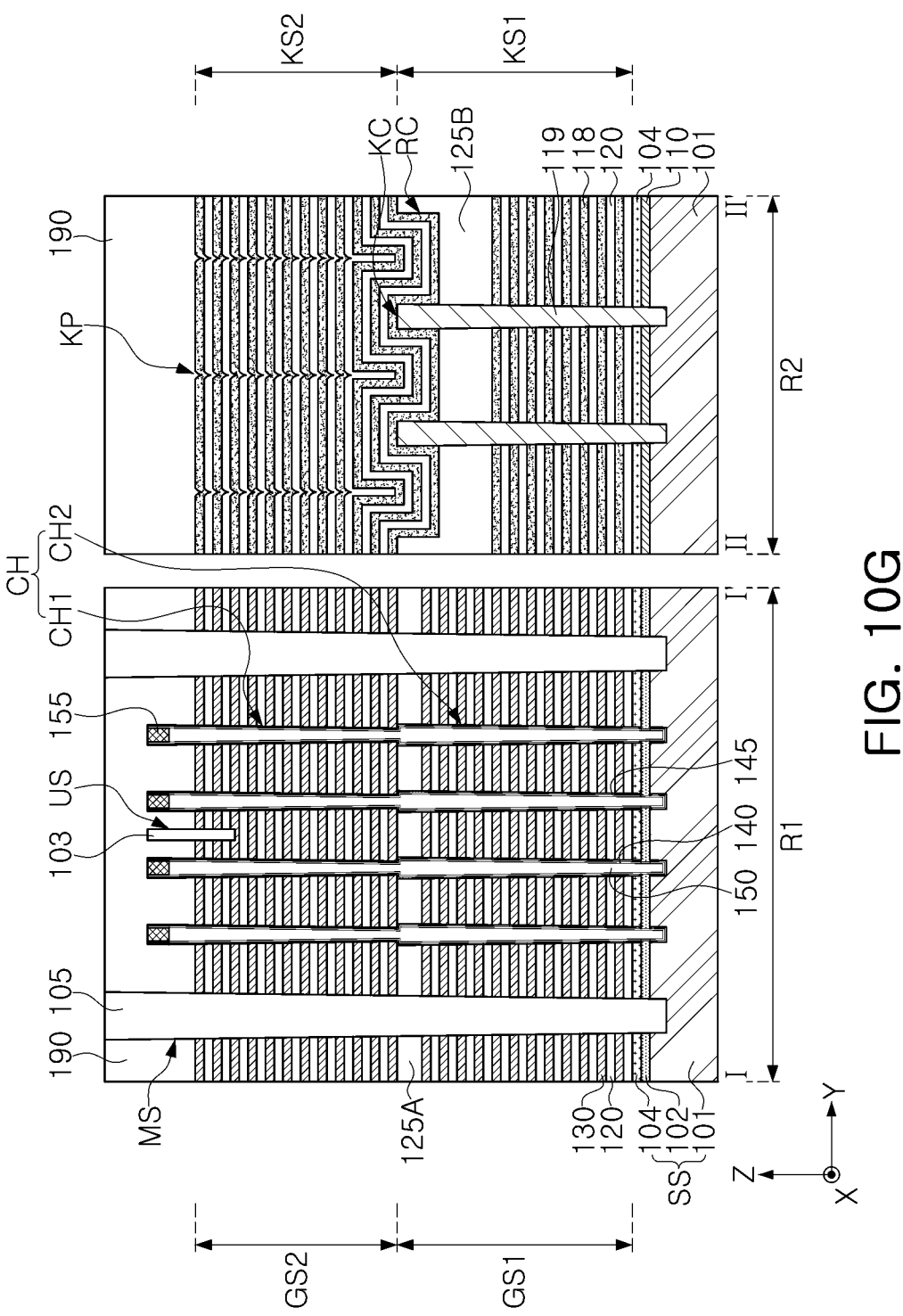

Referring to FIG. 10G, in the first region R1, gate electrodes 130 may be formed in tunnel portions TL, and an isolation insulating layer 105 may be formed in the openings OP.

In the first region R1, gate electrodes 130 may be formed in the tunnel portions TL from which the horizontal sacrificial layers 118 are removed. Accordingly, first and second stack structures GS1 and GS2 including the gate electrodes 130 may be formed in the first region R1. When a portion of the gate dielectric layer 145 extends horizontally along the gate electrodes 130, a portion of the gate dielectric layer 145 may be formed earlier than the gate electrodes 130 in this process. The gate electrodes 130 may include, for example, metal, polycrystalline silicon, or a metal silicide material.

After forming the gate electrodes 130, an isolation insulating layer 105 may be formed in the openings OP, thereby forming isolation regions MS.

Thereafter, referring to FIG. 2 together, by forming contact plugs 170 connected to the channel structures CH in the first region R1, the semiconductor device 100 may be manufactured. Although not illustrated, an interconnection structure such as interconnection lines may be further formed on the contact plugs 170.

Figure 11:
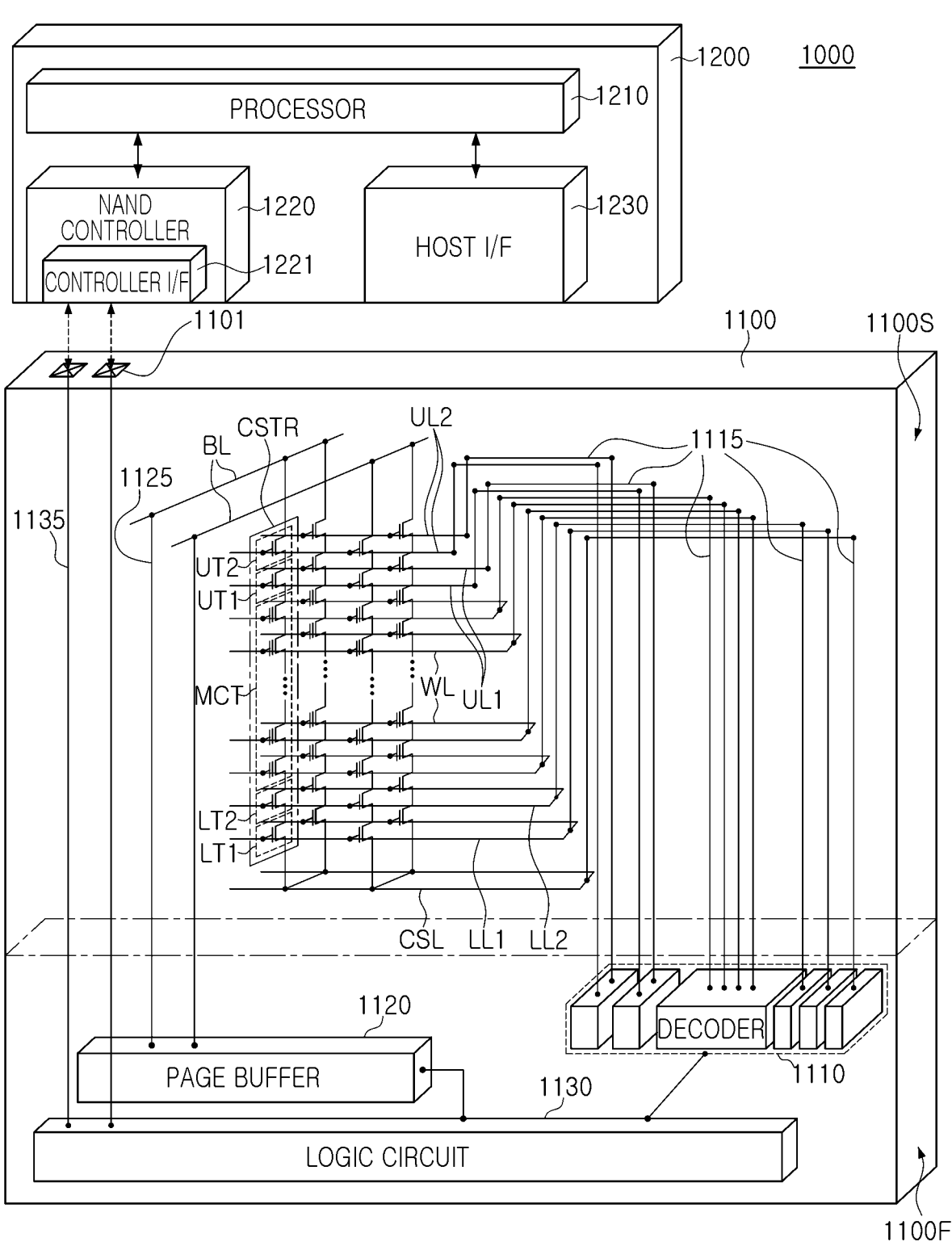
FIG. 11 is a view illustrating a data storage system including a semiconductor device according to an example embodiment of the present disclosure.

FIG. 11 is a view illustrating a data storage system including a semiconductor device according to an example embodiment.

Referring to FIG. 11, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described in the aforementioned example embodiment with reference to FIGS. 1 to 9B. The semiconductor device 1100 may include a first structure 1100F and a second structure 1100S on the first structure 1100F. In example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first structure 1100F to the second structure 1100S. The bit lines BL may be electrically connected to the page buffer 1120 through second connection interconnections 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pads 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a controller interface 1221 processing communication with the semiconductor device 1100. Through the controller interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command from an external host is received through the host interface 1230, the processor 1210 may control the semiconductor device 1100 in response to the control command.

Figure 12:
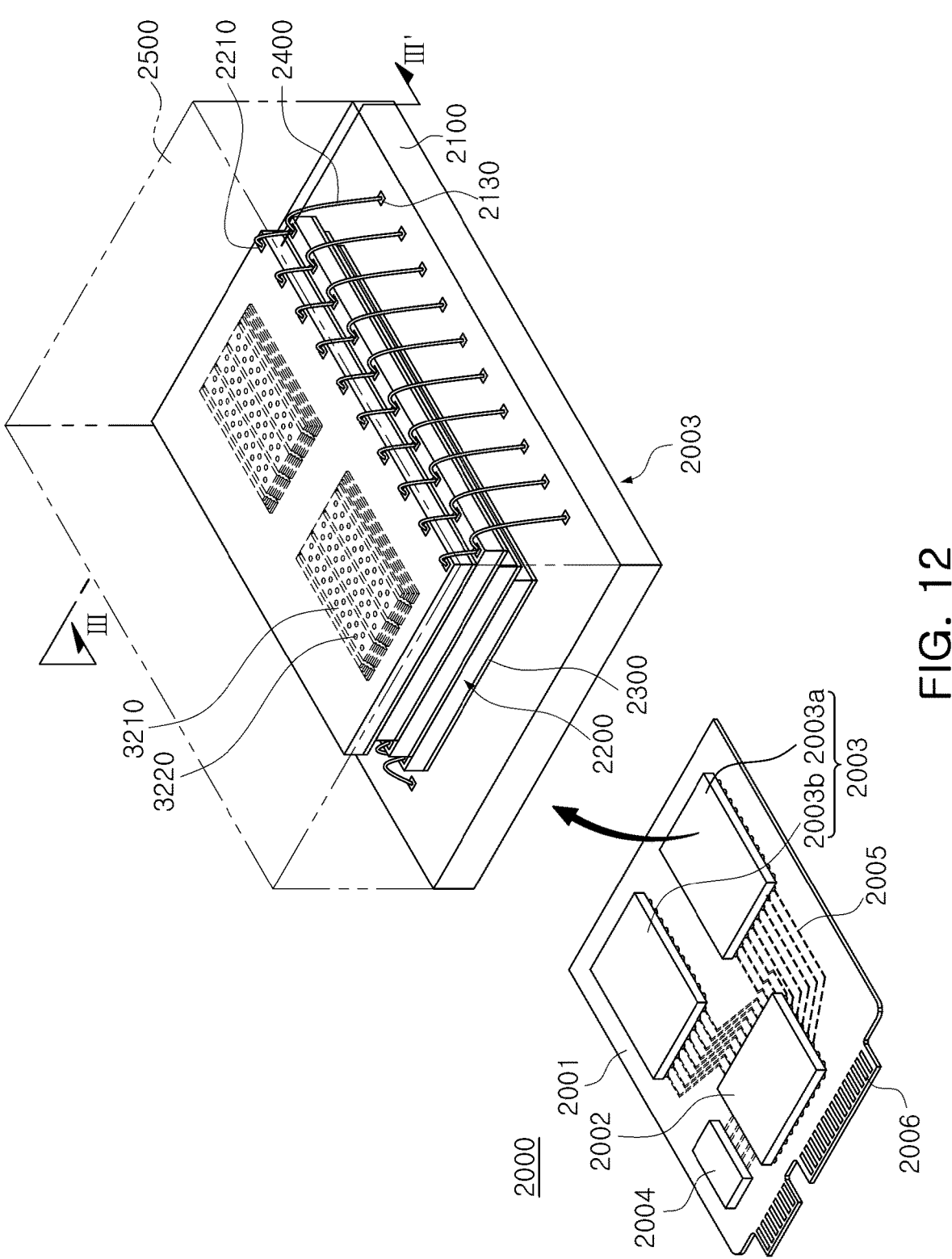
FIG. 12 is a perspective view illustrating a data storage system including a semiconductor device according to an example embodiment of the present disclosure.

FIG. 12 is a perspective view illustrating a data storage system including a semiconductor device according to an example embodiment.

Referring to FIG. 12 a data storage system 2000 in an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with an external host according to one of interfaces from among universal serial bus (USB), peripheral component interconnect express (PCI-Express), serial advanced technology attachment (SATA), M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 11. Each of the semiconductor chips 2200 may include gate stack structures 3210 and channel structures 3220. Each of the semiconductor chips 2200 may include the semiconductor device described in the aforementioned example embodiment with reference to FIGS. 1 to 9B.

In example embodiments, the connection structure 2400 may be configured as a bonding wire electrically connecting the input/output pad 2210 to the upper package pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-electrode (TSV) instead of the connection structure 2400 of a bonding wire method.

In example embodiments, the controller 2002 and the semiconductor chips 2200 may be included in a single package. In an example embodiment, the controller 2002 and the semiconductor chips 2200 may be mounted on a separate interposer substrate different from the main board 2001, and the controller 2002 and the semiconductor chips 2200 may be connected to each other interconnection formed on the interposer substrate.

Figure 13:
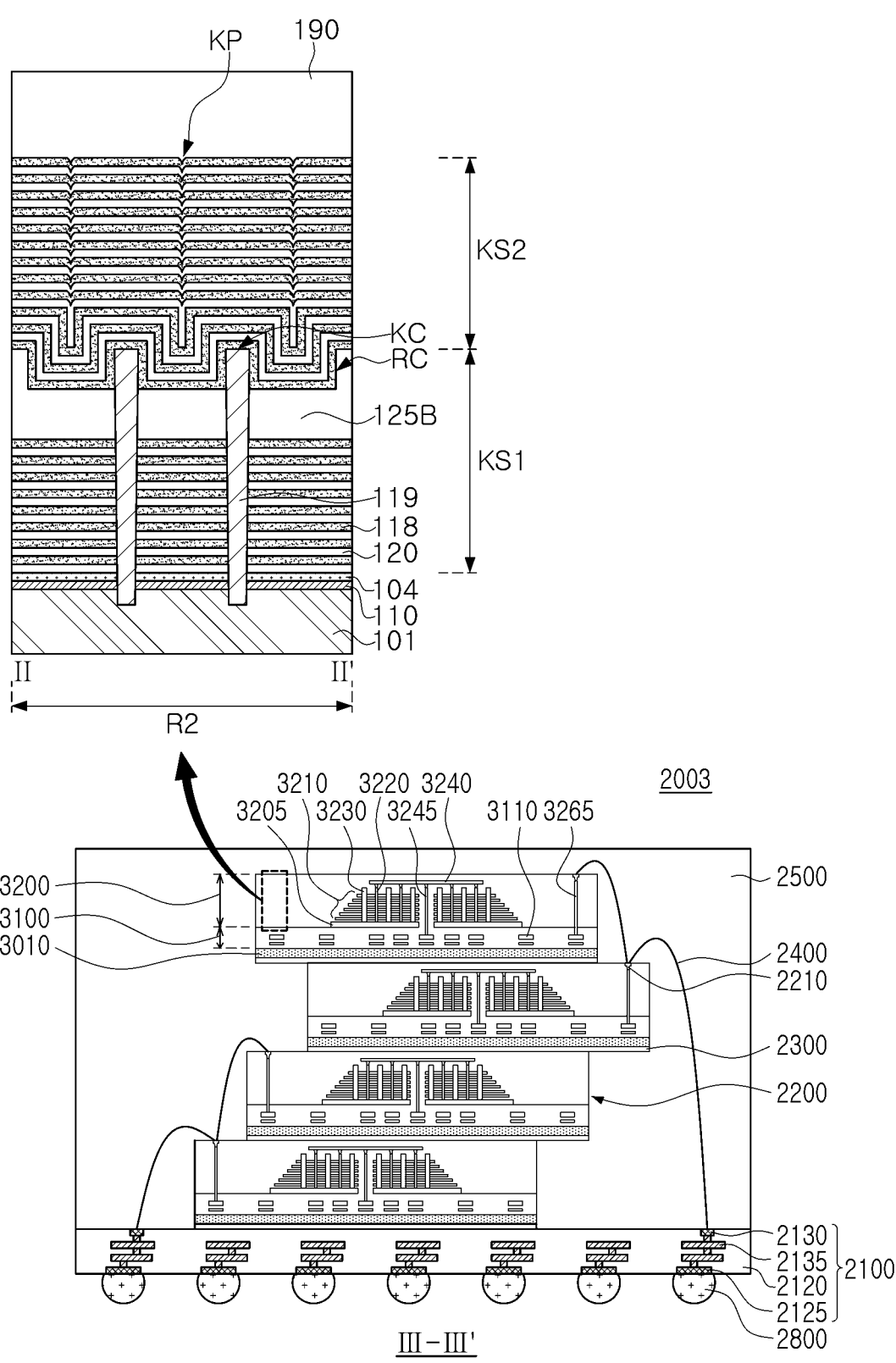
FIG. 13 is a cross-sectional view illustrating a semiconductor package according to an example embodiment of the present disclosure.

FIG. 13 is a cross-sectional view illustrating a semiconductor package according to an example embodiment, illustrating an example embodiment of the semiconductor package 2003 in FIG. 12 taken along line III-III'.

Referring to FIG. 13, in the semiconductor package 2003, the package substrate 2100 may be implemented as a printed circuit board. The package substrate 2100 may include a package substrate body 2120, package upper pads 2130 (see FIG. 12) disposed on the upper surface of the package substrate body 2120, lower pads 2125 disposed on the lower surface of the package substrate body 2120 or exposed through the lower surface, and internal interconnections 2135 electrically connecting the upper pads 2130 to the lower pads 2125 in the package substrate body 2120. The lower pads 2125 may be connected to the interconnection patterns 2005 of the main substrate 2010 of the data storage system 2000 as illustrated in FIG. 12 through conductive connection portions 2800.

Each of the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 penetrating through the gate stack structure 3210, bit lines 3240 electrically connected to the memory channel structures 3220, and contact plugs 3235 electrically connected to the word lines WL (see FIG. 11) of the gate stack structure 3210. As described in the aforementioned example embodiment with reference to FIGS. 1 to 9B, in each of the semiconductor chips 2200, key pattern portions KP for alignment during a manufacturing process and alignment structures KC may be disposed in one region of the substrate 101. The alignment structures KC may penetrate through the first mold structure KS1 including the horizontal sacrificial layers 118 less than the number of gate electrodes 130 of the first stack structure GS1.

Each of the semiconductor chips 2200 may include a through interconnection 3245 electrically connected to the peripheral interconnections 3110 of the first semiconductor structure 3100 and extending into the second semiconductor structure 3200. The through interconnection 3245 may penetrate through the gate stack structure 3210 and may be further disposed an external side of the gate stack structure 3210. Each of the semiconductor chips 2200 may further include an input/output connection 3265 electrically connected to the peripheral interconnections 3110 of the first semiconductor structure 3100 and extended into the second semiconductor structure 3200, and an input/output pad 2210 electrically connected to the input/output connection 3265.

According to the aforementioned example embodiments, by optimizing the stacking shape of the horizontal sacrificial layers in the mold structure in which the alignment structure is disposed, a semiconductor device having improved reliability and a data storage system including the same may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:
a substrate having first and second regions;
a first stack structure including lower gate electrodes stacked and spaced apart from each other in a first direction perpendicular to an upper surface of the substrate in the first region;
a first channel structure penetrating through the first stack structure and in contact with the substrate;
a second stack structure on the first stack structure and the first channel structure and including upper gate electrodes stacked and spaced apart from each other in the first direction;
a second channel structure penetrating through the second stack structure and connected to the first channel structure;
a first mold structure including lower horizontal sacrificial layers stacked and spaced apart from each other in the first direction in the second region;
an alignment structure penetrating through the first mold structure and in contact with the substrate; and
a second mold structure on the first mold structure and the alignment structure and including upper horizontal sacrificial layers stacked and spaced apart from each other in the first direction,
wherein the number of the lower horizontal sacrificial layers is less than the number of the lower gate electrodes.

2. The semiconductor device of claim 1, wherein the lower horizontal sacrificial layers are on substantially the same level as a level of a portion of the lower gate electrodes including a lowermost lower gate electrode.

3. The semiconductor device of claim 1, wherein a distance between an uppermost lower gate electrode among the lower gate electrodes and a lowermost upper gate electrode among the upper gate electrodes is less than a distance between an uppermost lower horizontal sacrificial layer among the lower horizontal sacrificial layers and a lowermost upper horizontal sacrificial layer among the upper horizontal sacrificial layers.

4. The semiconductor device of claim 1, wherein a lowermost first upper horizontal sacrificial layer among the upper horizontal sacrificial layers contacts a portion of an upper surface and a portion of a side surface of the alignment structure.

5. The semiconductor device of claim 4, wherein an upper surface of a second upper horizontal sacrificial layer on the lowermost first upper horizontal sacrificial layer is on a level lower than a level of an upper surface of the alignment structure on a circumference of the alignment structure.

6. The semiconductor device of claim 4, wherein a lowermost surface of the lowermost first upper horizontal sacrificial layer is on a level lower than a level of an upper surface of an uppermost lower gate electrode among the lower gate electrodes.

7. The semiconductor device of claim 1, wherein the number of the lower horizontal sacrificial layers is 2 to 7 fewer than the number of the lower gate electrodes.

8. The semiconductor device of claim 1, wherein the first region is a memory cell region in which memory cells are disposed, and the second region is an alignment key region in which alignment keys are disposed.

9. The semiconductor device of claim 1, wherein each of the upper horizontal sacrificial layers has a key pattern portion recessed in an upper surface to correspond to a circumference of the alignment structure.

10. The semiconductor device of claim 9,
wherein the second mold structure further includes interlayer insulating layers alternately stacked with the upper horizontal sacrificial layers, and
wherein each of the upper horizontal sacrificial layers and the interlayer insulating layers has the key pattern portion.

11. The semiconductor device of claim 9, wherein, in a portion of the upper horizontal sacrificial layers, the key pattern portion has a notch shape.

12. The semiconductor device of claim 1, wherein the first channel structure is on substantially the same level as a level of the alignment structure.

13. The semiconductor device of claim 1, wherein the alignment structure includes a carbon-based material.

14. A semiconductor device, comprising:
a substrate having first and second regions;
a first stack structure including lower gate electrodes stacked and spaced apart from each other in a first direction perpendicular to an upper surface of the substrate in the first region;
a first channel structure penetrating through the first stack structure;
a second stack structure on the first stack structure and the first channel structure and including upper gate electrodes stacked and spaced apart from each other in the first direction;
a second channel structure penetrating through the second stack structure and connected to the first channel structure;
a first mold structure including lower horizontal sacrificial layers stacked and spaced apart from each other in the first direction in the second region;
an alignment structure penetrating through the first mold structure; and
a second mold structure on the first mold structure and the alignment structure and including upper horizontal sacrificial layers stacked and spaced apart from each other in the first direction,
wherein a distance between an uppermost lower gate electrode among the lower gate electrodes and an upper end of the first channel structure is less than a distance between an uppermost lower horizontal sacrificial layer among the lower horizontal sacrificial layers and an upper end of the alignment structure in the first direction.

15. The semiconductor device of claim 14, wherein the first mold structure is on a level overlapping a level of the first stack structure, and the alignment structure is on the same level as a level of the first channel structure.

16. The semiconductor device of claim 14, wherein the number of the lower horizontal sacrificial layers is less than the number of the lower gate electrodes.

17. The semiconductor device of claim 14, wherein a lowermost surface of a lowermost upper horizontal sacrificial layer among the upper horizontal sacrificial layers is on a level lower than a level of an upper surface of the uppermost lower gate electrode.

18. The semiconductor device of claim 14, wherein a plurality of upper horizontal sacrificial layers among the upper horizontal sacrificial layers are on a level lower than a level of the upper end of the alignment structure.

19. A data storage system, comprising:

a semiconductor storage device including a substrate having first and second regions, circuit devices on one side of the substrate, and input/output pads electrically connected to the circuit devices; and a controller electrically connected to the semiconductor storage device through the input/output pads and controlling the semiconductor storage device, wherein the semiconductor storage device further includes:

a first stack structure including lower gate electrodes stacked and spaced apart from each other in a first direction perpendicular to an upper surface of the substrate in the first region;

a first channel structure penetrating the first stack structure and in contact with the substrate;

a second stack structure on the first stack structure and the first channel structure and including upper gate electrodes stacked and spaced apart from each other in the first direction;

a second channel structure penetrating through the second stack structure and connected to the first channel structure;

a first mold structure including lower horizontal sacrificial layers stacked and spaced apart from each other in the first direction in the second region;

an alignment structure penetrating through the first mold structure and in contact with the substrate; and a second mold structure on the first mold structure and the alignment structure and including upper horizontal sacrificial layers stacked and spaced apart from each other in the first direction, and wherein the number of the lower horizontal sacrificial layers is less than the number of the lower gate electrodes.

20. The data storage system of claim 19, wherein a distance between an uppermost lower gate electrode among the lower gate electrodes and an upper end of the first channel structure is less than a distance between an uppermost lower horizontal sacrificial layer among the lower horizontal sacrificial layers and an upper end of the alignment structure in the first direction.

\* \* \* \* \*